(12) United States Patent
Kim et al.

(10) Patent No.: US 12,501,631 B2
(45) Date of Patent: Dec. 16, 2025

(54) CAPACITOR, AND DEVICE COMPRISING THE SAME, AND METHOD OF PREPARING THE SAME

(71) Applicant: Samsung Electronics Co., Ltd., Suwon-si (KR)

(72) Inventors: Hyungjun Kim, Suwon-si (KR); Boeun Park, Suwon-si (KR); Jeongil Bang, Suwon-si (KR); Cheheung Kim, Suwon-si (KR); Jooho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 372 days.

(21) Appl. No.: 18/312,383

(22) Filed: May 4, 2023

(65) Prior Publication Data
US 2023/0402497 A1 Dec. 14, 2023

(30) Foreign Application Priority Data

Jun. 10, 2022 (KR) .................. 10-2022-0071036
Nov. 29, 2022 (KR) .................. 10-2022-0163246

(51) Int. Cl.
*H10D 1/68* (2025.01)
*H01G 4/10* (2006.01)
(Continued)

(52) U.S. Cl.
CPC .............. *H10D 1/682* (2025.01); *H01G 4/10* (2013.01); *H10B 12/30* (2023.02); *H10D 1/042* (2025.01); *H10D 1/696* (2025.01); *H10D 1/716* (2025.01)

(58) Field of Classification Search
CPC ........ H10D 1/682; H10D 1/042; H10D 1/696; H10D 1/716; H01G 4/10; H01G 4/40;
(Continued)

(56) References Cited

U.S. PATENT DOCUMENTS 7,709,359 B2 5/2010 Boescke et al.
11,244,951 B2 2/2022 Karda et al.
(Continued)

FOREIGN PATENT DOCUMENTS

JP 4080624 B2 4/2008

OTHER PUBLICATIONS

W. F. Qin et al., "Electrical behavior of Y-doped Ba0.6Sr0.4TiO3 thin films", J Mater Sci: Mater Electron (2007), vol. 18, pp. 1217-1220.
(Continued)

*Primary Examiner* — Elias Ullah
(74) *Attorney, Agent, or Firm* — HARNESS, DICKEY & PIERCE, P.L.C.

(57) ABSTRACT

A capacitor may include a first thin-film electrode layer; a second thin-film electrode layer; and a dielectric layer between the first thin-film electrode layer and the second thin-film electrode layer. The first thin-film electrode layer and the second thin-film electrode layer may include a conductive perovskite-type crystal structure. The dielectric layer may include a metal oxide having a dielectric perovskite-type crystal structure. The dielectric layer may be an epitaxial layer. The metal oxide may include a first element in a cubooctahedral site, a second element in an octahedral site, and a third element in an octahedral site. A valency of the third element may be lower than a valency of the second element, and the third element may be a dopant.

23 Claims, 22 Drawing Sheets

(51) Int. Cl.
*H10B 12/00* (2023.01)
*H10D 1/00* (2025.01)

(58) Field of Classification Search
CPC .... H01G 4/1236; H01G 4/1254; H01G 4/008;
H01G 4/085; H01G 4/1227; H01G 4/33;
H10B 12/30; H10B 12/033; H10B 12/34;
C04B 2235/3201; C04B 2235/3203;
C04B 2235/3205; C04B 2235/3208;
C04B 35/01; C04B 35/016; C04B 35/12;
C04B 35/26; C04B 35/44; C04B 35/462;
C04B 35/47; C04B 35/486; C04B 35/495;
C04B 35/62218; C04B 35/4682; C04B
2235/3206; C04B 2235/3213; C04B
2235/3215; C04B 2235/3217; C04B
2235/3224; C04B 2235/3225; C04B
2235/3227; C04B 2235/3229; C04B
2235/3241; C04B 2235/3256; C04B
2235/3262; C04B 2235/3272; C04B
2235/3275; C04B 2235/3279; C04B
2235/3286; C04B 2235/3289; C04B
2235/3298; C04B 2235/761; C04B
2235/768
See application file for complete search history.

(56) References Cited

U.S. PATENT DOCUMENTS

| | | |
|---|---|---|
| 2012/0044610 A1 | 2/2012 | Taylor et al. |
| 2018/0145084 A1 | 5/2018 | Karda et al. |
| 2019/0189626 A1 | 6/2019 | Karda et al. |
| 2021/0202510 A1 | 7/2021 | Thareja et al. |
| 2021/0203325 A1 | 7/2021 | Manipatruni et al. |
| 2021/0343872 A1 | 11/2021 | Ramamoorthy et al. |

OTHER PUBLICATIONS

R. Dittmann et al., "Sharp ferroelectric phase transition in strained single-crystalline SrRuO3 ÒBa0.7Sr0.3TiO3 ÒSrRuO3 capacitors", Appl. Phys. Lett. (2003), vol. 83, No. 24, pp. 5011-5013.
J.A. Kittl et al., "High-k dielectrics for future generation memory devices (Invited Paper)", Microelectronic Engineering, 86 (2009, 1789-1795.
Jeongmin Oh et al., "The dependence of dielectric properties on the thickness of (Ba,Sr) TiO3 thin films", Current Applied Physics 7 (2007) 168-171.
Ruey-Ven Wang et al., "Effect of Y doping and composition-dependent elastic strain on the electrical properties of thin films deposited at 520?° C.", Appl. Phys. Lett. 87, 192906 (2005).
European Search Report and the European search opinion dated Oct. 24, 2023, issued in corresponding European Application No. 23178593.2-1202.

CAPACITOR, AND DEVICE COMPRISING THE SAME, AND METHOD OF PREPARING THE SAME

CROSS-REFERENCE TO RELATED APPLICATIONS

This application is based on and claims priority under 35 U.S.C. § 119 to Korean Patent Application No. 10-2022-0071036, filed on Jun. 10, 2022, and Korean Patent Application No. 10-2022-0163246, filed on Nov. 29, 2022, in the Korean Intellectual Property Office, the disclosures of which are incorporated by reference herein in their entireties.

BACKGROUND

1. Field

The disclosure relates to a capacitor, a device including the same, and a method of preparing the same.

2. Description of the Related Art

Semiconductor devices, such as memories and transistors, are used in various household and industrial devices. In line with increasingly high performance of household and industrial devices, semiconductor devices are becoming highly integrated and miniaturized.

As the semiconductor device becomes highly integrated and miniaturized, the size of a semiconductor device decreases.

For example, since capacitance of the capacitor decreases and leakage currents may increase with a decreasing size of the capacitor, various methods are proposed to solve this issue.

For example, the capacitance of the capacitor may be maintained by modifying the structure of a capacitor, by increasing the electrode area of the capacitor, or by reducing the dielectric thickness, or by improving the capacitor manufacturing process.

SUMMARY

However, there are limitations to maintaining the capacitance of a capacitor by structural modifications, such as increasing the electrode surface of the capacitor or reducing the dielectric material thickness, or by improving the manufacturing process.

For high capacitance of a capacitor, a ternary oxide dielectric material may be utilized. A typical ternary oxide dielectric is a perovskite crystal structure material in which the composition ratio of divalent cations, tetravalent cations, and oxygen is 1:1:3, as a ternary oxide containing divalent cations and tetravalent cations. Examples of the ternary oxide dielectric material include materials such as $SrTiO_3$, $CaTiO_3$, $BaTiO_3$, $SrHfO_3$, $SrZrO_3$, and $PbTiO_3$. The ternary oxide dielectric material is not limited to the aforementioned materials, and a ternary oxide containing other cations may be utilized as dielectric material.

The ternary oxide dielectric material undergoes a drastic decrease of permittivity as the thin film thickness decreases. In addition, since the ternary oxide dielectric material has a small band gap of about 3 eV to about 4 eV, leakage currents between electrodes and dielectric material may be large.

Thus, it is important to inhibit a decrease in permittivity due to decrease in the thickness of dielectric thin film, and control leakage currents between electrodes and dielectric material.

To inhibit decrease in permittivity due to decrease in thickness of dielectric thin film, a polycrystalline dielectric material thin film having an increased grain size may be considered. The polycrystalline dielectric material thin film having an increased grain size may be prepared by implanting a dopant into an amorphous dielectric material thin film and inducing a phase-transition by a heat-treatment. The polycrystalline dielectric material thin film having an increased grain size may give rise to issues such as formation of low-k dielectric layer at the electrode-dielectric material interface and limited polarization alignment. Therefore, the polycrystalline dielectric material thin film having an increased grain size is limited in terms of controlling permittivity decrease at a thickness of 100 Å or less.

Therefore, there is a demand for a novel capacitor which, by having a novel structure compared to the conventional capacitors, can inhibit decrease in permittivity due to decrease in thickness of dielectric material thin film, and can control leakage currents between electrodes and dielectric material.

Provided is a capacitor which includes a dielectric material and an electrode having a novel structure, to thereby inhibit decrease in permittivity due to thickness decrease of dielectric material and control leakage currents.

Provided is a device including the capacitor.

Provided is a method of preparing the capacitor.

Additional aspects will be set forth in part in the description which follows and, in part, will be apparent from the description, or may be learned by practice of the presented embodiments of the disclosure.

According to an example embodiment, a capacitor may include a first thin-film electrode layer; a second thin-film electrode layer; and a dielectric layer between the first thin-film electrode layer and the second thin-film electrode layer. The first thin-film electrode layer and the second thin-film electrode layer each may have a conductive perovskite-type crystal structure. The dielectric layer may include a metal oxide having a dielectric perovskite-type crystal structure, and the dielectric layer may be an epitaxial layer. The metal oxide may include a first element in a cubooctahedral site, a second element in an octahedral site, and a third element in an octahedral site. A valency of the third element may be lower than a valency of the second element. The third element may be a dopant.

According to an example embodiment, a device may include the capacitor above.

According to an example embodiment, a method of preparing a capacitor may include forming a dielectric layer on one side of a first thin-film electrode layer by epitaxy growth; and forming a second thin-film electrode layer on the dielectric layer to thereby provide the capacitor. The capacitor may include the dielectric layer between the first thin-film electrode layer and the second thin-film electrode layer. The first thin-film electrode layer and the second thin-film electrode layer may have a conductive perovskite-type crystal structure. The dielectric layer may include a metal oxide having a dielectric perovskite-type crystal structure. The metal oxide may include a first element in a cubooctahedral site, a second element in an octahedral site, and a third element in an octahedral site. A valency of the third element may be lower than a valency of the second element. The third element may be a dopant.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
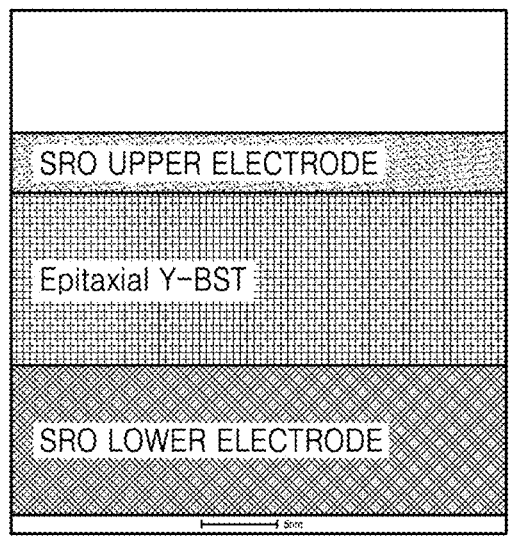
FIG. 1 is a cross-sectional view of a capacitor prepared in Example 1.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Embodiments of inventive concepts described below allow for various changes and numerous embodiments, particular embodiments will be illustrated in the drawings and described in detail in the written description. However, inventive concepts should not be construed as being limited to specific embodiments set forth herein. Rather, these embodiments are to be understood as encompassing all variations, equivalents, or alternatives included in the scope of inventive concepts.

The terminology used hereinbelow is used for the purpose of describing particular embodiments only and is not intended to limit inventive concepts. As used herein, the singular forms are intended to include the plural forms as well, unless the context clearly indicates otherwise. As used herein, the terms "comprises" and/or "comprising," or "includes" and/or "including" when used in this specification, specify the presence of stated features, regions, integers, steps, operations, elements, components, ingredients, materials, or combinations thereof, but do not preclude the presence or addition of one or more other features, regions, integers, steps, operations, elements, components, ingredients, materials, or combinations thereof. As used herein, "/" may be interpreted as "and", or as "or" depending on the context.

In the drawings, the thicknesses of layers and regions may be exaggerated for clarity and convenience of description. Like reference numerals denote like elements throughout the specification. When a component, such as a layer, a film, a region, or a plate, is described as being "above" or "on" another component, the component may be directly above the another component, or there may be yet another component therebetween. It will be understood that although the terms "first," "second," etc. may be used herein to describe various elements, these elements should not be limited by these terms. These terms are only used to distinguish one element from another element. In the present specification and drawings, components having substantially the same functional configuration are denoted by the same reference numerals, and redundant descriptions thereof are omitted.

Hereinafter, a capacitor according to example embodiments, a device including the same, and a method of preparing a capacitor will be described in greater detail.

A capacitor according to an embodiment may include: a first thin-film electrode layer; a second thin-film electrode layer; and a dielectric layer disposed between the first thin-film electrode layer and the second thin-film electrode layer, wherein the first thin-film electrode layer and the second thin-film electrode layer may include a conductive perovskite-type crystal structure, the dielectric layer may include a metal oxide having a dielectric perovskite-type crystal structure, the dielectric layer may be an epitaxial layer, and the metal oxide may include a first element disposed in a cubooctahedral site, a second element disposed in an octahedral site, and a third element disposed in an octahedral site, wherein a valency of the third element may be lower than a valency of the second element, and the third element may be a dopant.

The first thin-film electrode layer, the second thin-film electrode layer, and the interlayer may have a perovskite-type crystal structure. Between the first thin-film electrode layer and the second thin-film electrode layer, having a perovskite-type crystal structure, a dielectric layer having a well-defined orientation, that is, a dielectric layer with a perovskite-type crystal structure, may be positioned. For example, the dielectric layer may include a metal oxide having a perovskite-type crystal structure with high crystallinity. For example, the dielectric layer may include a metal oxide having a single crystal or a crystallinity close thereto. As the first thin-film electrode layer, the second thin-film electrode layer, and the dielectric layer all have the same perovskite-type crystal structure, formation of low-k dielectric layer at the electrode layer-dielectric layer interface may be inhibited. Since polarization alignment within the dielectric layer may be improved due to the dielectric layer having a high crystallinity, permittivity of the dielectric layer may be improved as a result. The first thin-film electrode layer, the second thin-film electrode layer, and the dielectric layer each may be, for example, a single crystal having a perovskite-type crystal structure.

As the metal oxide includes an octahedral site and a third element that has a lower valency than that of a second element is positioned in the octahedral site, there may be lattice expansion induced in the octahedral site, and as a result, a compressive strain in the lattice structure may be induced. As the lattice structure positioned at the electrode layer-dielectric layer interface contains a compressive strain induced without degradation, the interfacial permittivity between the electrode layer and the dielectric layer may increase. As the thickness of the dielectric layer decreases, the influence of interfacial permittivity between the dielectric layer and the electrode layer in addition to the bulk permittivity of dielectric material in the overall permittivity of the dielectric layer, increases. Accordingly, in a capacitor having a dielectric layer with an increased interfacial permittivity, decrease in permittivity of the capacitor due to a decrease in the thickness of the dielectric layer may be effectively suppressed.

The second element may have a valency of 4 or more, for example. The valency of the second element may be 4, 5, or 6. The third element may have a valency of 3 or less, for example. The valency of the third element may be 3, 2, or 1 for example. As the third element has a lower valency than the second element, lattice expansion in octahedral site may be more effectively induced.

For example, the third element may be a metal or metalloid element of Group 1 to Group 16 in the Periodic Table. The third element may be for example at least one element selected from among Y, Mg, Ni, Fe, Mn, Co, Al, Cr, Bi, Cr, and Ga. As the third element includes the aforementioned metal or metalloid elements, lattice expansion in octahedral site may be induced more effectively. The third element may one or more valence states. For example, Mn may have variable valency such as 2, 3, and the like.

The ionic radii of the third element may be, for example, greater than the ionic radii of the second element. As the ionic radii of the third element are greater than the ionic radii of the second element, lattice expansion in octahedral site may be more effectively induced. As the ionic radii of the third element increase, lattice expansion in octahedral site may increase. For example, a cation of the third element may have a larger ionic radius than that of a cation of the second element. The difference between the ionic radii of the third element and the ionic radii of the second element may be, for example, 1 pm or more, 5 pm or more, or 10 pm or more. The difference between the ionic radii of the third element and the ionic radii of the second element may be, for example, about 1 pm to about 50 pm, about 5 pm to about 50 pm, or about 10 pm to about 50 pm.

The metal oxide may be, for example, a ternary metal oxide. The ternary metal oxide may include a first element, a second element, and oxygen. At least one of the first element and the second element in the ternary metal oxide may be further substituted with another element. The substituted ternary metal oxide may further include, for example, a third element substituting part of the second element, and/or a fourth element substituting part of the first element.

Crystal lattice of the metal oxide may have, for example, a compressive stain along c-axis. As the metal oxide includes an octahedral site, and a third element having larger ionic radii than that of the second element is substituted in the octahedral site, the crystal lattice of the metal oxide may have, for example, a compressive stain along a perpendicular c-axis direction, that is, a direction coming out of the electrode layer-dielectric layer interface, for example. Due to deformation of the crystal lattice along c-axis, polarization may be more effectively induced, thus improving permittivity.

The metal oxide may include a crystal lattice, and the crystal lattice includes an a-axis lattice constant, a b-axis lattice constant, and a c-axis lattice constant, wherein the c-axis lattice constant may be greater than for example, at least one of the a-axis lattice constant and the b-axis lattice constant.

The c-axis lattice constant may be, for example, about 3.96 Å to about 4.20 Å, about 3.98 Å to about 4.20 Å, about 3.98 Å to about 4.15 Å, about 3.98 Å to about 4.10 Å, or about 4.00 Å to about 4.10 Å. As the c-axis lattice constant has a size in the aforementioned ranges, permittivity decrease due to volume reduction of a capacitor including a dielectric layer may be more effectively inhibited. The c-axis lattice constant may be measured from, for example, an XRD spectrum.

A content of the third element included in the metal oxide may be, for example, about 0.1 at % to about 9 at %, about 0.1 at % to about 7 at %, about 0.5 at % to about 5 at %, about 0.5 at % to about 3 at %, about 1.0 at % to about 2 at %, or about 1.5 at % to about 2 at %, with respect to the total sum of the second element and the third element. As the content of the third element in the metal oxide is in the aforementioned ranges, permittivity decrease due to volume reduction of a capacitor including a dielectric layer may be more effectively inhibited. The content of the third element may be measured, for example, by XPS.

The dielectric layer may include, for example, a metal oxide represented by Formula 1:

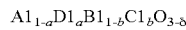
$$A1_{1-a}D1_aB1_{1-b}C1_bO_{3-\delta}$$ Formula 1

In Formula 1,
0≤a<1, 0.001<b<0.09, and 0≤δ≤0.5,
A1 and D1 each may be an element with a valency of 2,
B1 may be an element with a valency of 4, and
C1 may be an element with a valency of 1, an element with a valency of 2, or an element with a valency of 3.
In Formula 1, C1 may be for example at least one element selected from among Y, Mg, Ni, Fe, Mn, Co, Al, Cr, Bi, Cr, and Ga.

In Formula 1, for example, 0.1<a<0.9, 0.2<a<0.8, or 0.3<a<0.7.

The dielectric layer may include, for example, a metal oxide represented by Formula 2 below:

$$Ba_{1-a}Sr_aTi_{1-b}C2_bO_{3-\delta}$$ Formula 2

In Formula 2,

0≤a<1, 0.001<b<0.08 and 0≤δ≤0.5, and C2 may be at least one element selected from among Y, Mg, Ni, Fe, Mn, Co, Al, Cr, Bi, Cr, and Ga.

In Formula 2, for example, 0.1<a<0.9, 0.2<a<0.8, or 0.3<a<0.7.

On an XRD spectrum of the dielectric layer, a rocking curve may be measured by θ scan, for example, between the X-ray source and a sample surface. The rocking curve may have a first peak on (200) plane at a diffraction angle of θ=22.5°±0.5°, for example, and the full width at half maximum (FWHM) of the first peak may be 0.1° or less, 0.08° or less, or 0.06° or less. Due to the FWHM of the first peak of the dielectric layer being 0.1° or less, the dielectric layer may have high crystallinity. The dielectric layer may have, for example, a single crystal or a crystal structure similar thereto. The dielectric layer may have a crystal structure distinguished from a polycrystalline crystal structure and an amorphous structure.

The capacitor may include a dielectric layer, and have a first relative permittivity (εr1) at a thickness of 100 Å of the dielectric layer, and a second relative permittivity (εr2) at a thickness of 50 Å of the dielectric layer, wherein the ratio (εr2/εr1) of the first relative permittivity (εr1) to the second relative permittivity may be, for example, 0.20 or more, 0.25 or more, or 0.30 or more. For example, the ratio (εr2/εr1) of the first relative permittivity (ε) to the second relative permittivity may be, for example, 0.20 to 1.0, 0.25 to 0.90, or 0.30 to 0.80. As the capacitor has such a ratio (εr2/εr1) of the first relative permittivity to the second relative permittivity, permittivity decrease due to volume reduction of the capacitor may be effectively inhibited. The capacitor may include a dielectric layer, and at a thickness of the dielectric layer of about 20 Å to about 60 Å, or about 50 Å to about 60 Å, may have a relative permittivity may be 100 or more, 150 or more, 200 or more, 250 or more, 300 or more, 350 or more, or 400 or more. The permittivity of the dielectric layer may be measured at room temperature (25° C.) at 1 kHz to 1 MHz. The capacitor may include a dielectric layer, and at a dielectric layer thickness of about 20 Å to about 60 Å, or about 50 Å to about 60 Å, the leakage current of the capacitor may be, for example, $1\times10^{-6}$ A/cm² or less, $5\times10^{-7}$ A/cm² or less, or $1\times10^{-7}$ A/cm² or less.

For example, the thickness of the dielectric layer may be about 10 Å to about 500 Å, about 10 Å to about 300 Å, about 10 Å to about 100 Å, about 10 Å to about 80 Å, about 10 Å to about 60 Å, or about 30 Å to about 60 Å, or about 40 Å to about 60 Å. When the thickness of the dielectric layer is too small, the capacitance per unit volume of the capacitor may decrease. When the thickness of the dielectric layer is too large, it may be difficult to satisfy the volume that the capacitor requires of a memory device. The thickness of the dielectric layer may be measured by, for example, a transmission electron microscope, an atomic force microscope, and the like.

The dielectric layer may have one or more structures selected from, for example, a flat-plate structure, a trench structure, and a pillar structure, but is not limited thereto, and any structure available in the art may be used. The dielectric layer due to having such a structure may be applied to various types of devices. The dielectric layer may have, for example, a monolayer structure or a multilayer structure. The multilayer structure may be a two-layer structure, a three-layer structure, a four-layer structure, etc., but is not necessarily limited thereto, and may have a multilayer structure including more layers depending on required performance.

For example, the dielectric layer may be an epitaxial layer. For example, the dielectric layer may be formed by epitaxy growth. Accordingly, the dielectric layer may have the same or similar crystal structure, or the same or similar lattice constant, etc. as the thin-film electrode layer, and may have improved interfacial stability. A part of, or the entire dielectric layer may include an epitaxial region.

At least one selected from among the first thin-film electrode layer and the second thin-film electrode layer may include a metal oxide. The metal oxide may be, for example, a ternary metal oxide. The ternary metal oxide included in the electrode layer may include, for example, a first element. Thus, the first thin-film electrode layer and/or the second thin-film electrode layer, and the dielectric layer may all include a first element at the same time.

The first thin-film electrode layer and the second thin-film electrode layer may each independently include, for example, at least one selected from among $SrRuO_3$, $SrVO_3$, $SrNbO_3$, $SrMnO_3$, $SrCrO_3$, $SrFeO_3$, $SrCoO_3$, $SrMoO_3$, $SrIrO_3$, $SrCoO_3$, $CaRuO_3$, $CaNiO_3$, $BaRuO_3$, and $(Ba,Sr)RuO_3$.

The capacitor may further include an interlayer positioned either between the first thin-film electrode layer and the second thin-film electrode layer or between the second thin-film electrode layer and the dielectric layer, or both.

Since the ternary metal oxide dielectric material has a small band gap of about 3 eV to about 4 eV, leakage currents between the electrode layer and the dielectric layer may be large. Therefore, control of leakage currents between the electrode layer and the dielectric layer is important. To rectify leakage current characteristics between the electrode layer and the dielectric layer, the method of controlling the Schottky barrier may be considered. The Schottky barrier is the difference between the work function (φ) of the electrode layer and the electron affinity (χ, electron affinity) of the dielectric layer. When the electrode layer and the dielectric layer come into contact with each other, their Fermi levels are aligned, thus forming an energy barrier called the Schottky barrier at the interface between the electrode layer and the dielectric layer, which suppresses the movement of charges, thereby improving leakage current. Various conditions need to be met in order to realize high Schottky barrier height (SBH) between the dielectric layer and the electrode layer. For example, it may be required that the dielectric layer and the electrode layer have similar crystal structure and lattice constant, the dielectric layer-electrode layer interface have high stability, and the work function of the electrode layer be greater than the electron affinity of the dielectric layer. It may be difficult to derive a combination of the dielectric layer and the electrode layer that satisfies the above conditions. Therefore, by further introducing an interlayer between the electrode layer and the dielectric layer, leakage currents of the capacitor may be further suppressed by increasing the Schottky barrier height between the electrode layer and the dielectric layer.

The interlayer may have, for example, a crystal structure of the same type as at least one of the first thin-film electrode layer, the second thin-film electrode layer, and the dielectric layer, which are all in contact with the interlayer, and may have a different composition from those of the first thin-film electrode layer, the second thin-film electrode layer, and the dielectric layer.

The interlayer may have, for example, a perovskite-type crystal structure. Thus, the electrode layer, the dielectric layer and the interlayer may all have a perovskite-type crystal structure. For example, the interlayer may be a single crystal.

For example, the interlayer may include a metal oxide selected from metal oxides represented by Formulas 3 to 5:

$$A2B2O_{3-\delta 1}$$ Formula 3

In Formula 3,
A2 may be an element with a valency of 2, B2 may be an element with a valency of 1, an element with a valency of 2, or an element with a valency of 3, and $1.5 \leq \delta 1 \leq 3.0$, $$A3B3O_{3-\delta 2}$$ Formula 4

In Formula 4,
A3 may be an element with a valency of 1, B3 may be an element with a valency of 4, and $1.5 \leq \delta 2 \leq 3.0$.

$$A4B4O_{3-\delta 3}$$ Formula 5

In Formula 5,
A4 may be an element with a valency of 3, B4 may be an element with a valency of 3, and $2.5 \leq \delta 3 \leq 3.0$.

In Formula 3, for example, A2 may be a divalent cation, and B2 may be a monovalent cation, a divalent cation, or a trivalent cation and have an atomic weight of 20 or more. In Formula 4, for example, A3 may be a monovalent cation, and B3 may be a tetravalent cation. In Formula 5, for example, A4 may be a trivalent cation, and B4 may be a trivalent cation.

An interlayer may include, for example, a metal oxide that is selected from among $SrGaO_{3-\delta 1}$, $CaGaO_{3-\delta 1}$, $BaGaO_{3-\delta 1}$, $MgGaO_{3-\delta 1}$, $BeGaO_{3-\delta 1}$, $SrInO_{3-\delta 1}$, $CaInO_{3-\delta 1}$, $BaInO_{3-\delta 1}$, $MgInO_{3-\delta 1}$, $BeInO_{3-\delta 1}$, $SrBeO_{3-\delta 1}$, $CaBeO_{3-\delta 1}$, $BaBeO_{3-\delta 1}$, $MgBeO_{3-\delta 1}$, $SrMgO_{3-\delta 1}$, $CaMgO_{3-\delta 1}$, $BaMgO_{3-\delta 1}$, $BeMgO_{3-\delta 1}$, $SrBaO_{3-\delta 1}$, $CaBaO_{3-\delta 1}$, $MgBaO_{3-\delta 1}$, $BeBaO_{3-\delta 1}$, $SrCaO_{3-\delta 1}$, $BaCaO_{3-\delta 1}$, $MgCaO_{3-\delta 1}$, $BeCaO_{3-\delta 1}$, $SrLiO_{3-\delta 1}$, $CaLiO_{3-\delta 1}$, $BaLiO_{3-\delta 1}$, $MgLiO_{3-\delta 1}$, $BeLiO_{3-\delta 1}$, $SrNaO_{3-\delta 1}$, $CaNaO_{3-\delta 1}$, $BaNaO_{3-\delta 1}$, $MgNaO_{3-\delta 1}$, $BeNaO_{3-\delta 1}$, $SrKO_{3-\delta 1}$, $CaKO_{3-\delta 1}$, $BaKO_{3-\delta 1}$, $MgKO_{3-\delta 1}$, $BeKO_{3-\delta 1}$, $SrRbO_{3-\delta 1}$, $CaRbO_{3-\delta 1}$, $BaRbO_{3-\delta 1}$, $MgRbO_{3-\delta 1}$, and $BeRbO_{3-\delta 1}$; or selected from among $LiTiO_{3-\delta 2}$, $NaTiO_{3-\delta 2}$, $KTiO_{3-\delta 2}$, $RbTiO_{3-\delta 2}$, $LiZrO_{3-\delta 2}$, $NaZrO_{3-\delta 2}$, $KZrO_{3-\delta 2}$, $RbZrO_{3-\delta 2}$, $LiHfO_{3-\delta 2}$, $NaHfO_{3-\delta 2}$, $KHfO_{3-\delta 2}$, and $RbHfO_{3-\delta 2}$; or selected from among $ScAlO_{3-\delta 3}$, $YAlO_{3-\delta 3}$, $LaAlO_{3-\delta 3}$, $CeAlO_{3-\delta 3}$, $PrAlO_{3-\delta 3}$, $NdAlO_{3-\delta 3}$, $SmAlO_{3-\delta 3}$, $DyAlO_{3-\delta 3}$, $ScGaO_{3-\delta 3}$, $YGaO_{3-\delta 3}$, $LaGaO_{3-\delta 3}$, $CeGaO_{3-\delta 3}$, $PrGaO_{3-\delta 3}$, $NdGaO_{3-\delta 3}$, $SmGaO_{3-\delta 3}$, $DyGaO_{3-\delta 3}$, $ScInO_{3-\delta 3}$, $YInO_{3-\delta 3}$, $LaInO_{3-\delta 3}$, $CeInO_{3-\delta 3}$, $PrInO_{3-\delta 3}$, $NdInO_{3-\delta 3}$, $SmInO_{3-\delta 3}$, and $DyInO_{3-\delta 3}$, wherein $1.5 \leq \delta 1 \leq 3.0$, $1.5 \leq \delta 2 \leq 3.0$, and $2.5 \leq \delta 3 \leq 3.0$.

The interlayer may have a thickness of, for example, about 1 Å to about 15 Å, about 2 Å to about 12 Å, or about 2 Å to about 10 Å. As the interlayer has a thickness in the above ranges, the interlayer may have an increased Schottky barrier height (SBH) while maintaining structural stability of the interlayer.

In a capacitor including the interlayer, a Schottky Barrier Height (SBH) between the first thin-film electrode layer or second thin-film electrode layer and the dielectric layer, may be 1.5 eV or more, or 1.8 eV or more. For example, in a capacitor including the interlayer, a Schottky Barrier Height (SBH) between the first thin-film electrode layer or the second thin-film electrode layer and the dielectric layer may be about 1.5 eV to about 2.5 eV, or about 1.8 eV to about 2.1 eV. In a capacitor including the interlayer, leakage currents may be more effectively controlled as the Schottky barrier height between the first thin-film electrode layer or second thin-film electrode layer, and the dielectric layer has a value within the above ranges.

The interlayer may be, for example, an epitaxial layer. The interlayer may be formed by epitaxy growth for example. The interlayer may have, for example, the same or similar crystal structure, the same or similar lattice constant, etc., as that of the thin film electrode layer and/or the dielectric layer, and interfacial stability may be improved.

The type of the capacitor is not particularly limited. The capacitor may be, for example, a capacitor element included in a memory cell, a multilayer capacitor used in a multilayer ceramic condenser, and the like.

FIG. 8A to FIG. 8G are schematic diagrams of a capacitor 20 according to an embodiment.

Figure 8A:
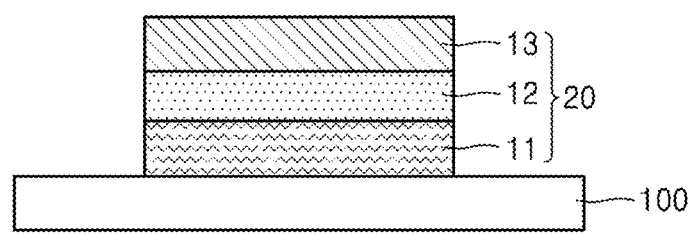
FIG. 8A to FIG. 8G are schematic diagrams of a capacitor according to an embodiment.

FIG. 8A shows a structure of the capacitor 20 including the above-described dielectric layer 12. In this structure, the capacitor 20 may include an insulating substrate 100, and a first thin-film electrode 11, a dielectric layer 12, and a second thin-film electrode 13. The first thin-film electrode 11 and the second thin-film electrode 13 may act as a lower thin-film electrode and an upper thin-film electrode, respectively. The first thin-film electrode 11 and the second thin-film electrode 13 may not be electrically connected, and the dielectric layer 12 may be positioned between the first thin-film electrode 11 and the second thin-film electrode 13. The dielectric layer 12 may be doped with a third element, and the first thin-film electrode 11, the dielectric layer 12, and the second thin-film electrode 13 may have a perovskite-type crystal structure. The third element may be, for example, Y, Mg, Ni, Fe, Mn, Co, Al, Cr, Bi, Cr, or Ga. Between the first thin-film electrode 11 and the dielectric layer 12 and/or between the second thin-film electrode 13 and the dielectric layer 12, an interlayer may be further arranged. For example, as depicted in FIG. 8E, the interlayer 9 may be between the first thin-film electrode 11 and the dielectric layer 12. As depicted in FIG. 8F, the interlayer 9 may be between the second thin-film electrode 13 and the dielectric layer 12.

FIGS. 8B to 8D and 8G show an example of another structure of a capacitor 20 including the dielectric layer 12 as described above.

Figure 8B:
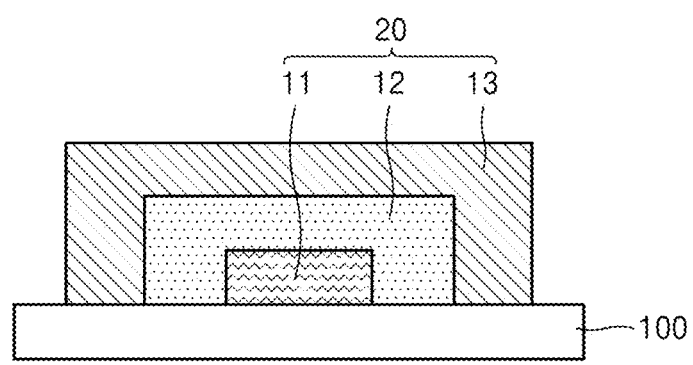

In FIG. 8B, a dielectric layer 12 may be arranged so as to cover a first thin-film electrode 11 on an insulating substrate 100, and a second electrode 13 may be arranged so as to cover the dielectric layer 12. The dielectric layer 12 may be doped with a third element, and the first thin-film electrode 11, the dielectric layer 12, and the second thin-film electrode 13 may have a perovskite-type crystal structure. Between the first thin-film electrode 11 and the dielectric layer 12 and/or between the second thin-film electrode 13 and the dielectric layer 12, an interlayer (not illustrated) may be further arranged.

Figure 8C:
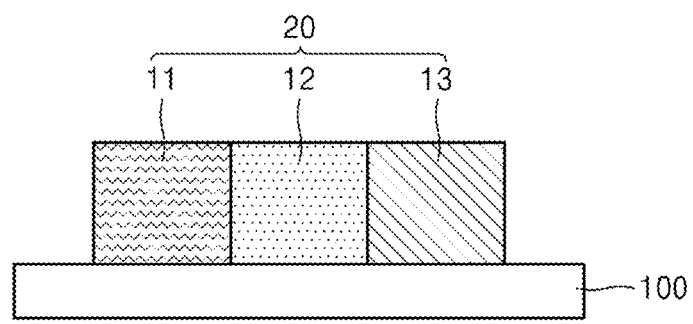

In FIG. 8C, on the insulating substrate 100, the first thin-film electrode 11 and the second thin-film electrode 13 may be arranged, and the dielectric layer 12 may be arranged therebetween. The dielectric layer 12 may be doped with a third element, and the first thin-film electrode 11, the dielectric layer 12, and the second thin-film electrode 13 may have a perovskite-type crystal structure. Between the first thin-film electrode 11 and the dielectric layer 12 and/or between the second thin-film electrode 13 and the dielectric layer 12, an interlayer (not illustrated) may be further arranged.

Figure 8D:
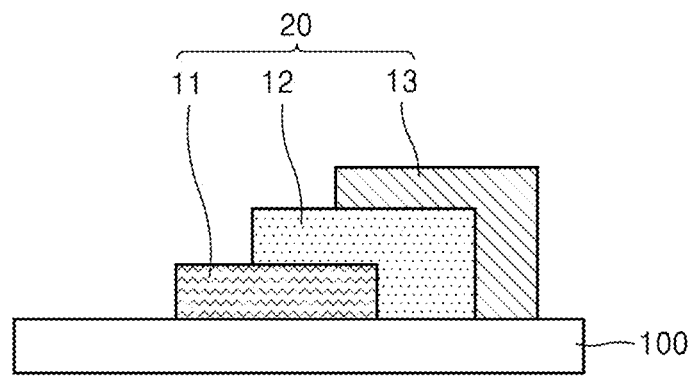
Figure 8E:
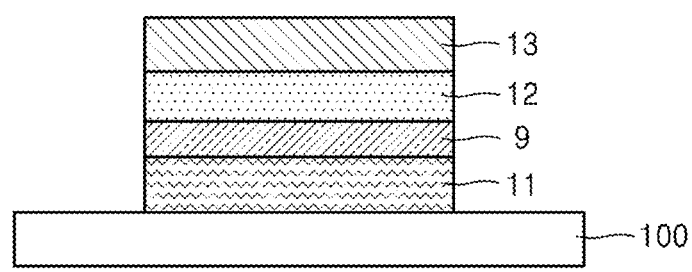
Figure 8F:
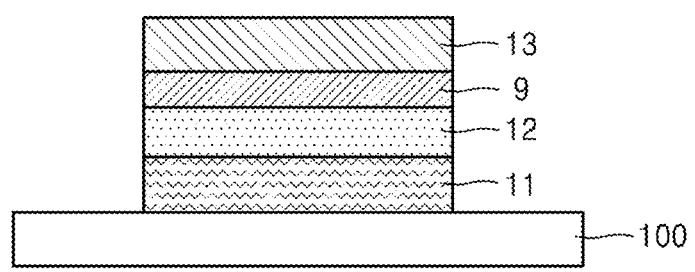

In FIG. 8D, the dielectric layer 12 may be arranged so as to cover part of the first thin-film electrode 11 on the insulating substrate 100, and the second thin-film electrode 13 may be arranged so as to cover another part of the dielectric layer 12. The dielectric layer 12 may be doped with a third element, and the first thin-film electrode 11, the dielectric layer 12, and the second thin-film electrode 13 may have a perovskite-type crystal structure. Between the first thin-film electrode 11 and the dielectric layer 12 and/or between the second thin-film electrode 13 and the dielectric layer 12, an interlayer (not illustrated) may be further arranged.

Figure 8G:
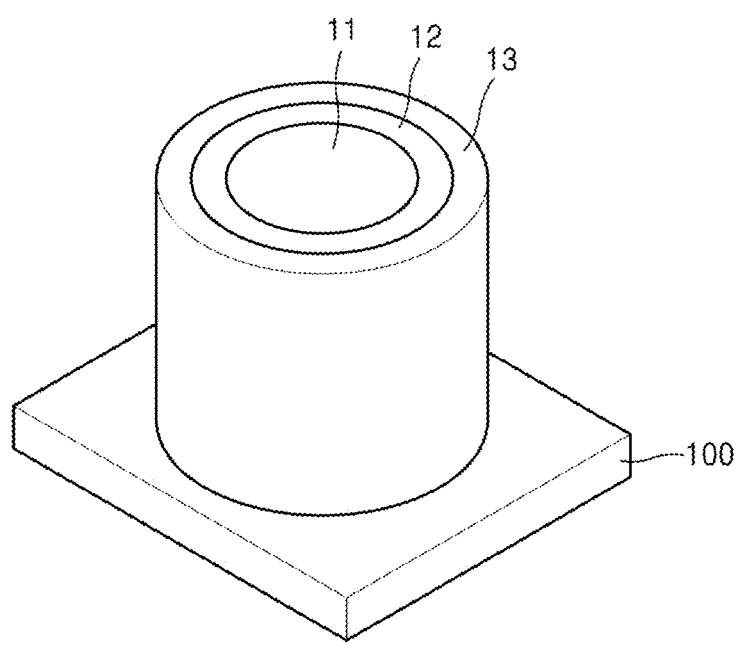

In FIG. 8G, the dielectric layer 12 may be arranged to surround the first thin-film electrode 11 on the insulating substrate 100, and the second thin-film electrode 13 may surround the dielectric layer 12. The first thin-film electrode 11, the dielectric layer 12, and the second thin-file electrode 13 may be concentrically arranged with the dielectric layer 12 in between the first and second thin-film electrodes 11 and 13. Although not shown, an interlayer may be between the dielectric layer 12 and at least one of the first and second thin-film electrodes 11 and 13.

The above-described capacitors may be employed in various electronic devices. The above-described capacitor may be utilized as a DRAM device with a transistor. In addition, the above-described capacitors may form part of an electronic circuit that constitutes an electronic device with other circuit elements.

Figure 9:
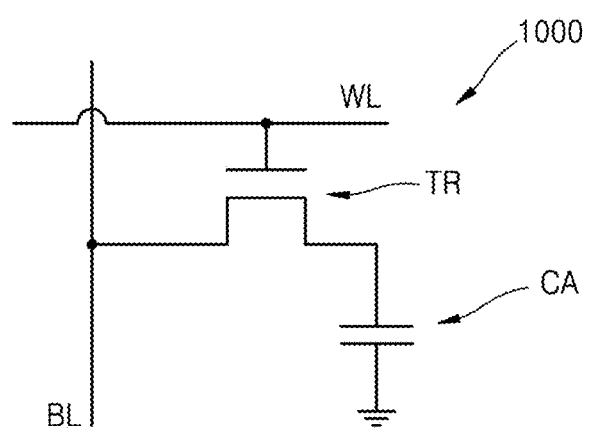
FIG. 9 is a circuit diagram schematically showing a circuit configuration and operation of an electronic device employing a capacitor according to embodiments.

FIG. 9 shows a circuit diagram showing a schematic circuit configuration and operation of an electronic device that employs a capacitor according to embodiments.

The circuit diagram of an electronic device 1000 concerns a single dynamic random access memory (DRAM) cell, which includes a single transistor TR, a single capacitor CA, a word line WL, and a bit line BL. The capacitor CA may be a capacitor described in FIG. 1 and FIGS. 10A to 10D.

Data may be written to a DRAM as follows. After applying to the gate electrode, a gate voltage (high) turning the transistor TR into 'ON' state via the word line WL, VDD (high) which is a data voltage value to input to the bit line BL, or 0 (low) may be applied. Once high voltage is applied to the word line and the bit line, the capacitor CA may be charged to write data "1". Once high voltage is applied to the word line and low voltage is applied to the bit line, the capacitor CA is discharged, writing "0".

When reading data, to turn the transistor TR of DRAM, high voltage is applied to the word line WL and VDD/2 voltage is applied to the bit line BL. If the data of DRAM is "1", that is, the voltage of the capacitor CA is VDD, charges in the capacitor CA slowly move to the bit line BL, causing the voltage of the bit line BL to be slightly higher than VDD/2. On contrary, while the data of the capacitor CA is "0", charges in the bit line BL move to the capacitor CA, causing the voltage of the bit line BL to be slightly lower than VDD/2. The electric potential difference thus generated is detected at a sense amplifier, and by amplifying the value, whether the corresponding data is "0" or "1" may be determined.

Figure 10:
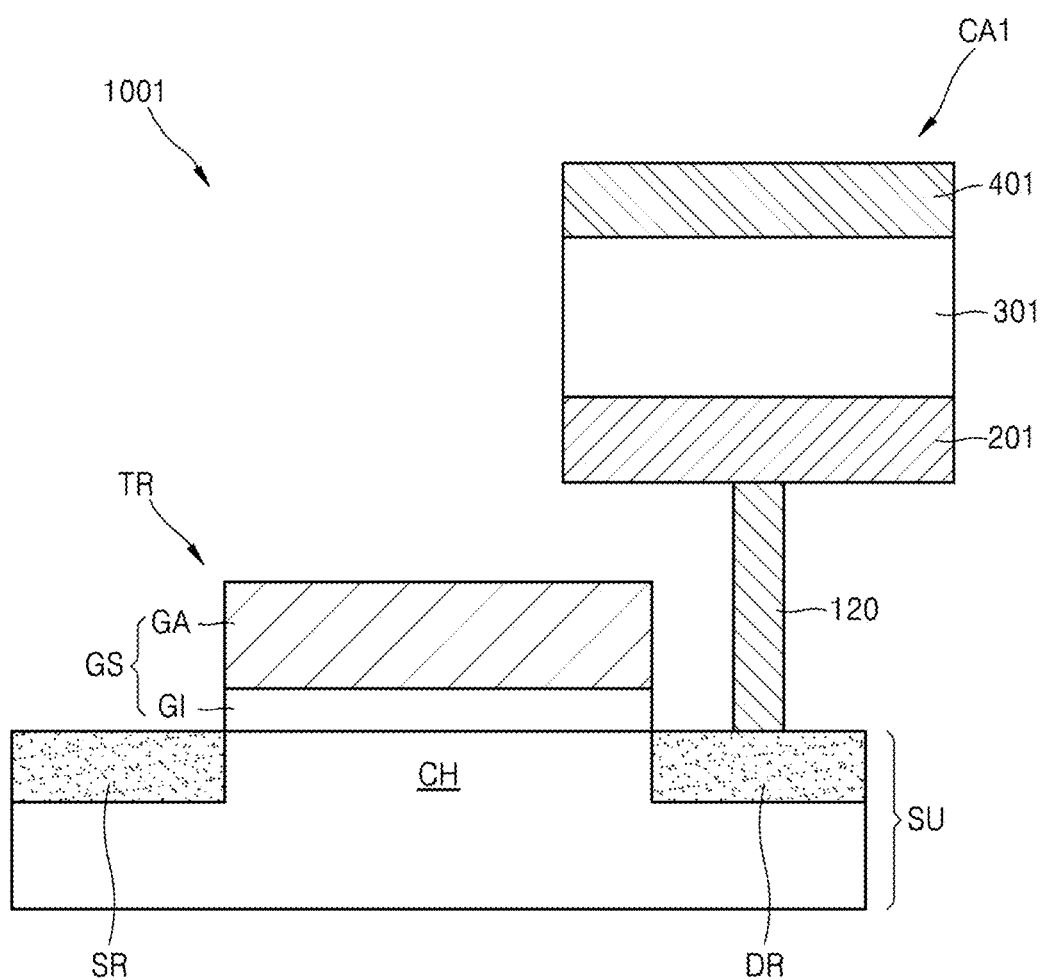
FIG. 10 is a schematic diagram showing an electronic device according to an embodiment.

FIG. 10 is a schematic diagram showing an electronic device according to an embodiment.

Referring to FIG. 10, an electronic device 1001 may have a capacitor CA1 and a transistor TR electrically connected to each other by a contact 120. The capacitor CA1 may include a lower electrode 201, an upper electrode 401, and a dielectric thin film 301 provided between the lower electrode 201 and the upper electrode 401. The capacitor CA1 may be a capacitor as described with reference to FIG. 1 and FIGS. 8A to 8G, which is described above. Therefore, further descriptions thereof will be omitted.

The transistor TR may be a field effect transistor. The transistor TR may include a semiconductor substrate SU provided with a source region SR, a drain region DR, and a channel region CH, and a gate stack GS disposed facing the channel region CH on the semiconductor substrate SU, and provided with a gate insulation layer GI and a gate electrode GA.

The channel region CH, which is a region between the source region SR and the drain region DR, may be electrically connected to the source region SR and the drain region DR. The source region SR may be electrically connected or in contact with one end portion of the channel region CH, and the drain region DR may be electrically connected or in contact with the other end portion of the channel region CH. The channel region CH may be defined as a substrate region between the source region SR and the drain region DR in the semiconductor substrate SU.

The semiconductor substrate SU may include a semiconductor material. The semiconductor substrate SU may include a semiconductor material such as, for example, silicon (Si), germanium (Ge), silicon germanium (SiGe), silicon carbide (SiC), gallium arsenide (GaAs), indium arsenide (InAs), indium phosphide (InP), and the like. In addition, the semiconductor substrate SU may include a silicon-on-insulator (SOI) substrate.

The source region SR, the drain region DR, and the channel region CH may be independently formed by implanting impurities into different regions of the semiconductor substrate SU. In this case, the source region SR, the channel region CH, and the drain region DR may include a substrate material as a base material. The source region SR and the drain region DR may be formed of a conductive material. In this case, the source region SR and the drain region DR may include, for example, a metal, a metal compound, or a conductive polymer.

Unlike as shown in the drawings, the channel region CH may be implemented as a separate material layer (thin film). In this case, the channel region CH may include, for example, at least one from among Si, Ge, SiGe, a semiconductor of Group III-V, an oxide semiconductor, a nitride semiconductor, an oxynitride semiconductor, a two-dimensional material (2D material), a quantum dot, and organic semiconductors. The oxide semiconductor may include InGaZnO and the like, for example. The 2D material may include transition metal dichalcogenide (TMD) or graphene for example. The quantum dot may include, for example, a colloidal QD or a nanocrystal structure.

The gate electrode GA may be arranged on the semiconductor substrate SU so as to face the channel region CH while being spaced apart from the semiconductor substrate SU. The gate electrode GA may include at least one from among a metal, a metal nitride, a metal carbide, and a polysilicon. The metal may include, for example, at least one from among aluminum (Al), tungsten (W), molybdenum (Mo), titanium (Ti), and tantalum (Ta). The metal nitride film may include, for example, at least one from among a titanium nitride film (TiN film) and a tantalum nitride film (TaN film). The metal carbide may include, for example, one or more from among metal carbides doped (or containing) with aluminum and silicon. The metal carbide may include, for example, TiAlC, TaAlC, TiSiC, or TaSiC.

The gate electrode GA may have a structure in which a plurality of materials are stacked. The gate electrode GA may have, for example, a multilayer structure of metal nitride layer/metal layer, such as TiN/Al, etc. or may have a multilayer structure of metal nitride layer/metal carbide layer/metal layer, such as TiN/TiAlC/W. The aforementioned materials for use in the gate electrode GA are only examples, and the gate electrode GA is not limited thereto.

A gate insulating layer GI may be further disposed between the semiconductor substrate SU and the gate electrode GA. The gate insulating layer GI may include a paraelectric material or a high-k dielectric material. The gate insulating layer GI may have a dielectric constant of about 20 to about 70, for example.

The gate insulating layer GI may include, for example, silicon oxide, silicon nitride, aluminum oxide, hafnium oxide, zirconium oxide, or the like, or may include a 2D insulator such as hexagonal boron nitride (h-BN). The gate insulating layer GI may include, for example, silicon oxide ($SiO_2$), silicon nitride ($SiN_x$), or the like, and may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), or the like. For example, the gate insulating layer (GI) may include a metal oxynitride such as aluminum oxynitride (AlON), zirconium oxynitride (ZrON), hafnium oxynitride (HfON), lanthanum oxynitride (LaON), yttrium oxynitride (YON), and the like; silicate such as ZrSiON, HfSiON, YSiON, LaSiON, and the like; or aluminate such as ZrAlON, HfAlON, and the like. The gate insulating layer GI may include, for example, the dielectric layer of the capacitor described above. The gate insulating layer GI may constitute a gate stack together with the gate electrode GA.

One of electrodes 201, 401 of the capacitor CA1 and one of the source region SR and the drain region DR of the transistor TR may be electrically connected by the contact 120. The contact 120 may include any suitable conductive material, such as tungsten, copper, aluminum, polysilicon, or the like.

The arrangement of the capacitor CA1 and the transistor TR may be subject to various modifications. For example, the arrangement may be such that the capacitor CA1 is disposed on the semiconductor substrate SU, or embedded in the semiconductor substrate SU.

Although in FIG. 10, an electronic device 1001 is illustrated as including one capacitor CA1 and one transistor TR, this is merely an example, and the electronic device 1001 may include a plurality of capacitors and a plurality of transistors.

Figure 11:
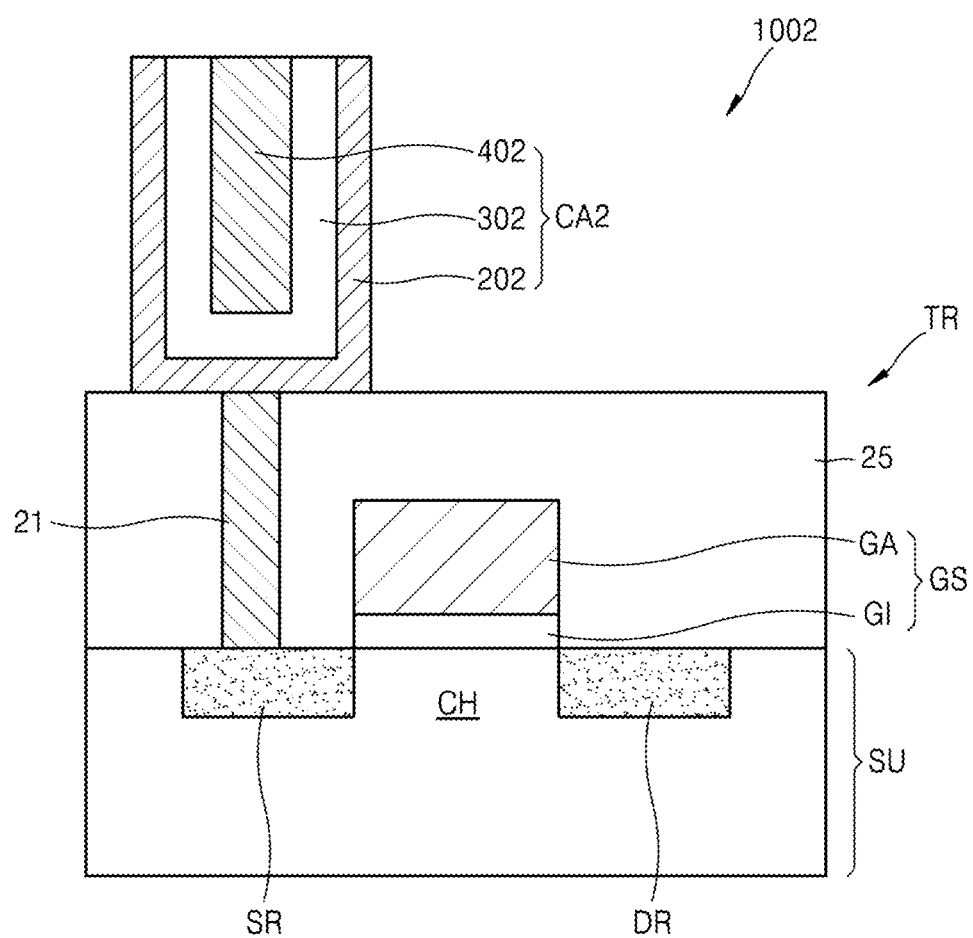
FIG. 11 is a schematic diagram showing an electronic device according to another embodiment.

FIG. 11 shows an electronic device according to another embodiment.

Referring to FIG. 11, an electronic device 1002 may include a structure in which a capacitor CA2 and a transistor TR are electrically connected via a contact 21.

The transistor TR may include a semiconductor substrate SU provided with a source region SR, a drain region DR, and a channel region CH, and a gate stack GS disposed facing the channel region CH on the semiconductor substrate SU, and provided with a gate insulating layer 25 and a gate electrode GA.

An interlayer insulating layer 25 may be provided on the semiconductor substrate SU so as to cover the gate stack GS. The interlayer insulating film 25 may include an insulating material. The interlayer insulating film 25 may include, for example, an Si oxide (e.g., $SiO_2$), an Al oxide (e.g., $Al_2O_3$), or a high-k dielectric material (e.g., $HfO_2$). The contact 21 may pass through the interlayer insulating film 25 and electrically connect the transistor TR and the capacitor CA1 to each other.

The capacitor CA1 may include a lower electrode 202, an upper electrode 402, and a dielectric thin film 302 provided between the lower electrode 202 and the upper electrode 402. A lower electrode 110 and an upper electrode 402 may be proposed to have a shape that maximizes the contact surface with a dielectric material thin film 170, and the material of a capacitor CA2 may be substantially identical to any one of the capacitors described in FIG. 1 and FIGS. 8A to 8G.

Figure 12:
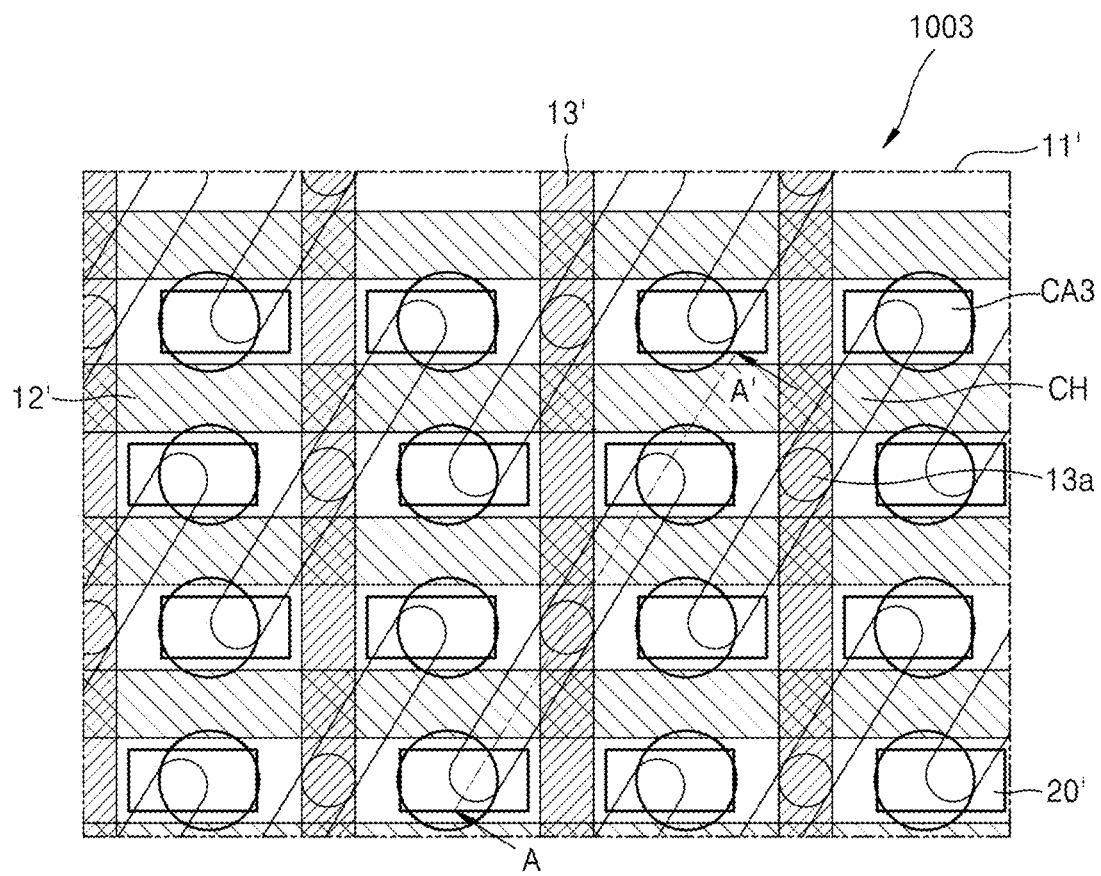
FIG. 12 is a plan view of an electronic device according to another embodiment.

FIG. 12 is a plan view of an electronic device according to another embodiment.

As shown in FIG. 12, an electronic device 1003 may include a structure in which a plurality of capacitors and a plurality of field effect transistors are repeatedly arranged. An electronic device 1003 may include a semiconductor substrate 11' including a source, a drain, and a channel, a field-effect transistor including a gate stack 12', a contact structure 20' disposed on the semiconductor substrate 11' so as to not overlap the gate stack 12', and a capacitor CA3 disposed on the contact structure 20', and may further include a bit line structure 13' electrically connecting a plurality of field-effect transistors. The material of a capacitor CA3 may be substantially identical to any one of the capacitors described in FIG. 1 and FIGS. 8A to 8G.

FIG. 12 illustrates, as an example, an arrangement in which the contact structure 20' and the capacitor CA3 are repeatedly arranged along X-direction and Y-direction, but the arrangement is not limited thereto. The contact structure 20' may be, for example, arranged along X direction and Y direction, and the capacitor C3 may be arranged in a hexagonal shape such as a honeycomb structure. Alternatively, the capacitor CA3 may have, for example, a circular shape, a triangular shape, a rectangular shape, a pentagonal shape, or the like. The capacitor CA3 may have, for example, a circular pillar shape, a triangular pillar shape, a rectangular pillar shape, a pentagonal pillar shape, or the like. The square pillar shape may have a square pillar shape, a rectangular pillar shape (sheet shape), or the like, for example.

Figure 13:
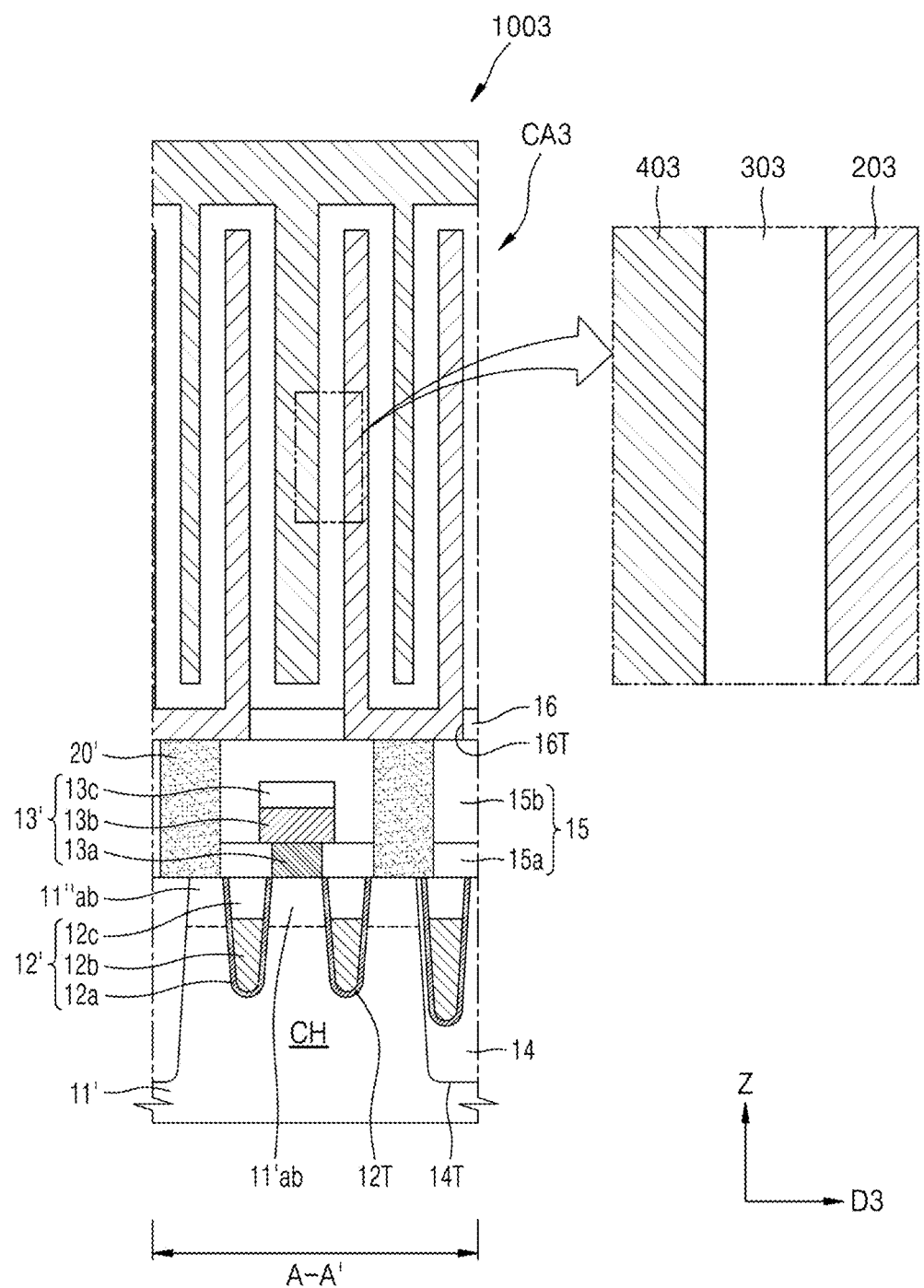
FIG. 13 is a cross-sectional view illustrating an electronic device according to another embodiment.

FIG. 13 is a cross-sectional diagram viewed along A-A' in FIG. 12.

Referring to FIG. 13, the semiconductor substrate 11' may have a shallow trench isolation (STI) structure including a device separator 14. The device separator 14 may be a monolayer consisting of one type of insulating film, or a multilayer consisting of a combination of two or more types of insulating films. The device separator 14 may include a device separation trench 14T within the semiconductor substrate 11', and the device separation trench 14T may be filled with an insulating material. The insulating material may include, but is not limited to, at least one from among FSG (fluoride silicate glass), USG (undoped silicate glass), BPSG (boro-phospho-silicate glass), PSG (phospho-silicate glass), FOX (flowable oxide), PE-TEOS (plasma enhanced tetra-ethyl-ortho-silicate), and TOSZ (tonen silazene).

Figure 15:
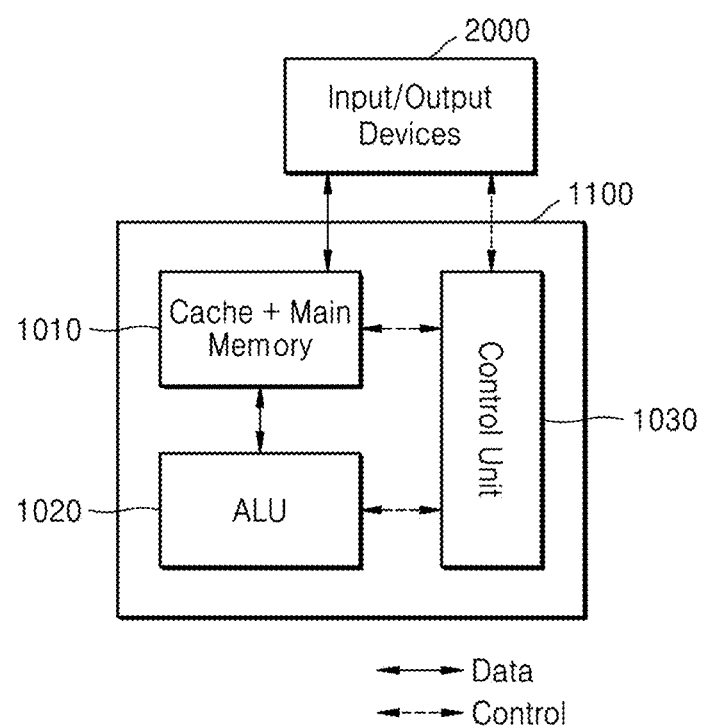
FIG. 15 is a schematic diagram schematically showing a device architecture applicable to a device according to an embodiment.

The semiconductor substrate 11' may further include a channel region CH defined by the device separation film 14 and a gate line trench 12T disposed parallel to an upper surface of the semiconductor substrate 11' and extending along X direction. The channel region CH may have an elongated island shape having a minor axis and a major axis. The major axis of the channel region CH may be arranged, as illustrated in FIG. 15 as an example, along D3 direction parallel to the upper surface of the semiconductor substrate 11'.

The gate line trench 12T may be positioned so as to intersect the channel region CH to a desired and/or alternatively predetermined depth from the upper surface of the semiconductor substrate 11', or may be positioned within the channel region CH. The gate line trench 12T may be positioned in the device separation trench 14T, and the gate line trench 12T within the device separation trench 14T may have a bottom surface lower than the gate line trench 12T of the channel region CH. First source/drain 11'ab and second source/drain 11"ab may be arranged on an upper portion of a channel region CH located at both sides of the gate line trench 12T.

The gate stack 12' may be positioned within the gate line trench 12T. In particular, a gate insulating layer 12a, a gate electrode 12b, and a gate capping layer 12c may be sequentially positioned within the gate line trench 12T. The gate insulating layer 12a and the gate electrode 12b are described above, and the gate capping layer 12c may include at least one from among a silicon oxide, a silicon oxynitride, and a silicon nitride. The gate capping layer 12c may be positioned on a gate electrode GA so as to fill the remaining region of the gate line trench 12T.

A bit line structure 13' may be positioned on the first source/drain 11'ab. The bit line structure 13' may be arranged so as to be parallel to an upper surface of a semiconductor substrate 11' and extend along Y-direction. The bit line structure 13' may be electrically connected to the first source/drain 11'ab and may include a bit line contact 13a, a bit line 13b, and a bit line capping layer 13c, sequentially on the substrate. The bit line contact 13a may include, for example, a polysilicon. The bit line 13b may include, for example, a metal material. The bit line capping layer 13c may include an insulating material such as silicon nitride or silicon oxynitride, and the like.

Although in FIG. 13, the bit line contact 13a is illustrated as having a bottom surface at the same level as an upper surface of the semiconductor substrate 11', but this is only an example and non-limiting. For example, in another embodiment, a recess formed to a desired and/or alternatively predetermined depth from the upper surface of the semiconductor substrate 11' may be further provided, and the bit line contact 13a may extend into the recess such that the bottom surface of the bit line contact 13a may be formed at a lower level than the upper surface of the semiconductor substrate 11'.

The bit line structure 13' may further include a bit line interlayer (not illustrated) between the bit line contact 13a and the bit line 13b. The bit line interlayer may include, for example, a metal silicide such as tungsten silicide, or a metal nitride such as tungsten nitride. A bit line spacer (not illustrated) may be further formed on a sidewall of the bit line structure 13'. The bit line spacer may have a monolayer structure or a multilayer structure. The bit line spacer may include, for example, an insulating material such as silicon oxide, silicon oxynitride, or silicon nitride. The bit line spacer may further include, for example, an air space (not illustrated).

The contact structure 20' may be arranged on the second source/drain 11"ab. The contact structure 20' and the bit line structure 13' may be arranged on different sources/drains on the substrate. The contact structure 20' may have a structure in which a lower contact pattern (not illustrated), a metal silicide layer (not illustrated), and an upper contact pattern (not illustrated) are sequentially stacked on the second source/drain 11"ab. The contact structure 20' may further include a barrier layer (not illustrated) surrounding side surfaces and a bottom surface of the upper contact pattern. The lower contact pattern may include, for example, a polysilicon. The upper contact pattern may include, for example, a metal material. The barrier layer may include, for example, a metal nitride having conductivity.

The capacitor CA3 may be disposed on the semiconductor substrate 11' electrically connected to the contact structure 20'. Specifically, the capacitor CA3 may include a lower electrode 203 electrically connected to the contact structure 20', an upper electrode 403 spaced apart from the lower electrode 203, and a dielectric thin film 303 disposed between the lower electrode 203 and the upper electrode 403. The lower electrode 203 may have a cylindrical shape or a cup shape having an inner space with a closed bottom. The upper electrode 403 may have the shape of a comb that has teeth extending into the inner space formed by the lower electrode 203 and into regions between adjacent lower electrodes 203. The dielectric thin film 303 may be disposed between the lower electrode 203 and the upper electrode 403 so as to be parallel to surfaces thereof.

Materials of the lower electrode 203, the dielectric thin film 303, and the upper electrode 403 constituting the capacitor CA3, may be substantially the same as those of any one of the capacitors described in FIG. 1 and FIGS. 8A to 8G and therefore will not be further described.

An interlayer insulating layer 15 may be further disposed between the capacitor CA3 and the semiconductor substrate 11'. The interlayer insulating layer 15 may be disposed in a space between the capacitor CA3 and the semiconductor substrate 11' where no other structure is disposed. Specifically, the interlayer insulating layer 15 may be disposed to cover wiring and/or electrode structures such as the bit line structure 13', the contact structure 20', and the gate stack 12' on the substrate. For example, the interlayer insulating layer 15 may surround a wall of the contact structure 20'. The interlayer insulating film 15 may include a first interlayer insulating film 15a surrounding the bit line contact 13a and a second interlayer insulating film 15b covering side surfaces and/or top surfaces of the bit line 13b and the bit line capping layer 13c.

The lower electrode 203 of the capacitor CA3 may be disposed on the interlayer insulating layer 15, specifically, on the second interlayer insulating layer 15b. When a plurality of capacitors CA3 are disposed, bottom surfaces of a plurality of lower electrodes 203 may be separated by an etch stop layer 16. In other words, the etch stop layer 16 may include an opening 16T, and the bottom surface of the lower electrode 203 of the capacitor CA3 may be disposed in the opening 16T. As illustrated, the lower electrode 203 may have a cylindrical shape or a cup shape having an inner space with a closed bottom. The capacitor CA3 may further include a support portion (not shown) that prevents the lower electrode 203 from tilting or collapsing, and the support portion may be disposed on a sidewall of the lower electrode 203.

Figure 14:
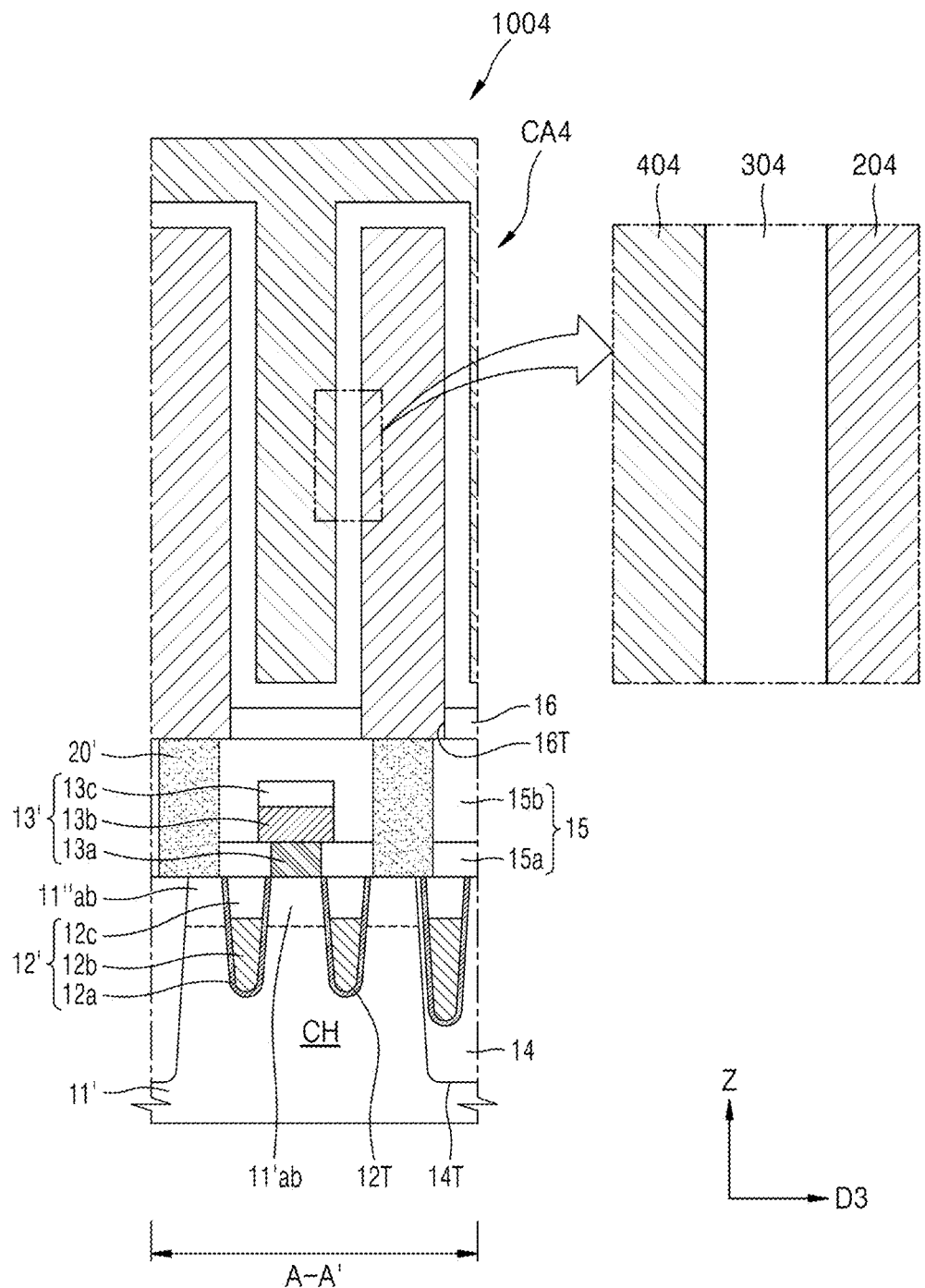
FIG. 14 is a cross-sectional view of an electronic device according to another embodiment.

FIG. 14 is a cross-sectional view of an electronic device according to another embodiment.

An electronic device 1004 according to the present embodiment is illustrated as a cross-sectional view corresponding to the A-A' cross-sectional view in FIG. 12, and differs from FIG. 13 only in terms of the shape of a capacitor CA4. The capacitor CA4 may be electrically connected to the contact structure 20' and disposed on the semiconductor substrate 11', and may include a lower electrode 204 electrically connected to the contact structure 20', an upper electrode 404 spaced apart from the lower electrode 204, and a dielectric thin film 304 disposed between the lower electrode 204 and the upper electrode 404. Materials of the lower electrode 204, the dielectric thin film 304, and the upper electrode 404 may be substantially the same as those of the any one of capacitors described above in FIG. 1 and FIGS. 8A to 8G.

The lower electrode 204 may have a pillar shape such as a cylinder, a rectangular pillar, or a polygonal pillar extending in a vertical direction (Z direction). The upper electrode 404 may have the shape of a comb having teeth extending into regions between adjacent lower electrodes 204. The dielectric thin film 304 may be disposed between the lower electrode 204 and the upper electrode 404 so as to be parallel to surfaces thereof.

The capacitor and the electronic device according to embodiments described above may be applied to various fields of applications. For example, the electronic device according to embodiments may be applied as a logic device or a memory device. An electronic device according to embodiments may be used for arithmetic operations, program execution, temporary data retention, and the like, in devices such as mobile devices, computers, laptops, sensors, network devices, neuromorphic devices, and the like. In addition, an electronic element and electronic device according to embodiments may be useful for a device in which the amount of data transmission is large and data transmission is continuously performed.

Figure 16:
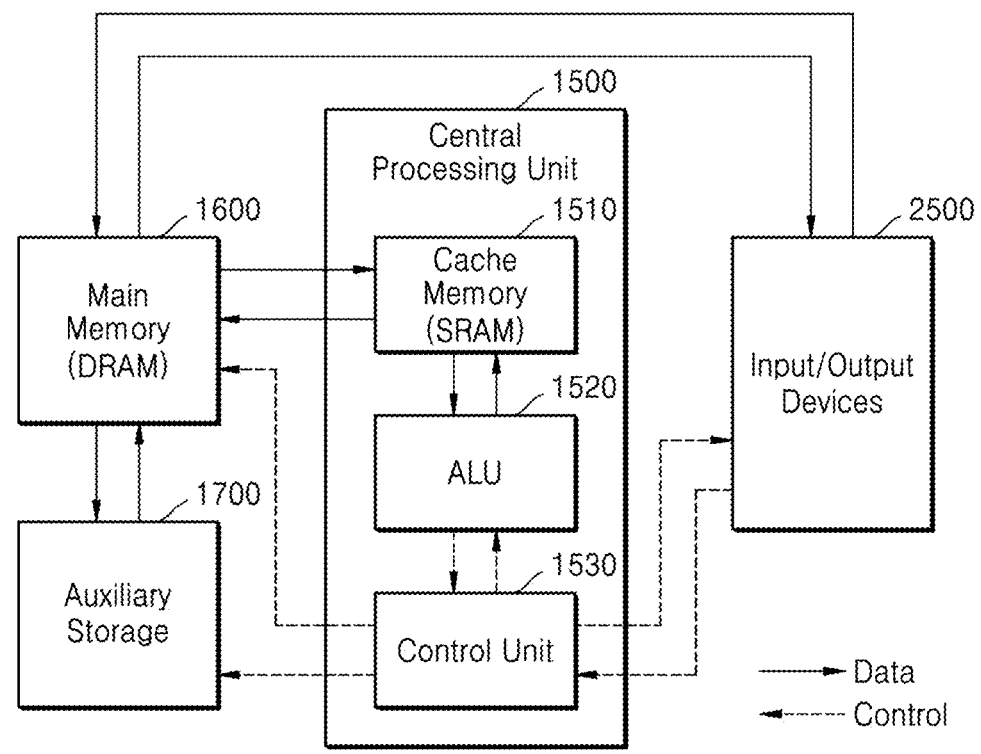
FIG. 16 is a schematic diagram schematically showing a device architecture applicable to a device according to another embodiment.

FIG. 15 and FIG. 16 are schematic diagrams schematically showing a device architecture applicable to a device according to an embodiment.

Referring to FIG. 15, an electronic device architecture 1100 may include a memory unit 1010, an arithmetic logic unit (ALU) 1020, and a control unit 1030. The memory unit 1010, the ALU 1020, and the control unit 1030 may be electrically connected. The electronic device architecture 1100 may be implemented, for example, as a single chip including the memory unit 1010, the ALU 1020, and the control unit 1030.

The memory unit 1010, the ALU 1020, and the control unit 1030 may be connected to each other through a metal line on-chip and communicate directly. The memory unit 1010, the ALU 1020, and the control unit 1030 may be monolithically integrated on a single substrate to form a single chip. An input/output device 2000 may be connected to the electronic device architecture (chip) 1100. The memory unit 1010 may include both a main memory and a cache memory. Such an electronic device architecture (chip) 1000 may be an on-chip memory processing unit. The memory unit 1010 may include the aforementioned capacitor and an electronic device utilizing the same. The ALU 1020 or the control unit 1030 may also each include the aforementioned capacitor.

Referring to FIG. 16, a cache memory 1510, an ALU 1520, and a control unit 1530 may configure a central processing unit (CPU) 1500, and the cache memory 1510 may include static random access memory (SRAM). Apart from the CPU 1500, a main memory 1600 and an auxiliary storage 1700 may be provided. The main memory 1600 may be dynamic random access memory (DRAM) and may include the capacitor described above. The electronic device architecture may be implemented in a form in which computing unit devices and memory unit devices are adjacent to each other on a single chip without distinction between sub-units.

Although one or more embodiments have been described with reference to the drawings and examples, these embodiments are merely examples, and those skilled in the art shall understand that various modifications are possible therefrom.

The above-described capacitor and the electronic device including the same are described with reference to embodiments illustrated in the drawings, but these are merely examples, and those skilled in the art shall understand that various modifications and equivalent other embodiments are possible therefrom. Therefore, the embodiments disclosed herein should be considered in a descriptive sense only and not for purposes of limitation. The full scope of inventive concepts shall be defined by the appended claims, and shall be construed as including all variations equivalent thereto.

A method of preparing a capacitor according to another embodiment may include: providing a first thin-film electrode layer or a second thin-film electrode layer; arranging a dielectric layer on one side of the first thin-film electrode layer or second thin-film electrode layer by epitaxy growth; and arranging another thin-film electrode layer on the dielectric layer to thereby provide the capacitor, wherein the capacitor may include a first thin-film electrode layer; a second thin-film electrode layer; and a dielectric layer positioned between the first thin-film electrode layer and the second thin-film electrode layer, wherein the first thin-film electrode layer and the second thin-film electrode layer have a conductive perovskite-type crystal structure, the dielectric layer may include a metal oxide having a dielectric perovskite-type crystal structure, wherein the metal oxide may include a first element disposed in a cubooctahedral site, a second element disposed on an octahedral site, and a third element disposed on an octahedral site, a valency of the third element may be lower than a valency of the second element, and the third element may be a dopant. A capacitor prepared by the method described above may have inhibited a decrease in permittivity due to volume reduction of the capacitor and reduced leakage currents.

In the method of preparing a capacitor, the epitaxy growth may be conducted at a temperature of 600° C. or less, 550° C. or less, or 500° C. or less. For example, the epitaxy growth may be conducted at a temperature of about 400° C. to about 600° C., about 450° C. to about 550° C., about 470° C. to about 530° C., or about 480° C. to about 520° C. As the epitaxy growth is conducted at a relatively lower temperature as above, production efficiency of the dielectric layer may be significantly improved. Consequently, improvement in the manufacture efficiency of a device and a capacitor including the dielectric layer and reduction of the manufacturing costs may be achieved.

The method of preparing a capacitor may further include, prior to the disposing of a dielectric layer by epitaxy growth on one side of the first thin-film electrode layer or second thin-film electrode layer, disposing an interlayer by epitaxy growth on one side of the first thin-film electrode layer or second thin-film electrode layer. As the capacitor includes the interlayer, further reduction of leakage currents of the capacitor may be achieved.

Referring to FIGS. 8A to 8G, a first thin-film electrode layer 11 or a second thin-film electrode layer 13 may be first provided.

The first thin-film electrode 11 and the second thin-film electrode 13 may include, for example, a metal oxide selected from among strontium-ruthenium oxide ($SrRuO_3$), iridium-ruthenium oxide ($SrIrO_3$), calcium-ruthenium oxide ($CaRuO_3$), or calcium-nickel oxide ($CaNiO_3$), barium-ruthenium oxide ($BaRuO_3$), and barium-strontium-ruthenium oxide ($(Ba,Sr)RuO_3$). The first thin-film electrode 11 and the second thin-film electrode 13 may be a metal oxide having a perovskite-type crystal structure. The first thin-film electrode 11 and/or the second thin-film electrode 13 may be a strontium-ruthenium oxide ($SrRuO_3$).

The first thin-film electrode 11 and/or the second thin-film electrode 13 may be formed through deposition of a metal, a metal oxide, a metal nitride, a metal oxynitride or an alloy, by processes such as an electron-beam epitaxy process, a liquid phase epitaxy process, a vapor phase epitaxy process, a chemical vapor deposition process, a sputtering process, an atomic layer deposition process, a pulsed laser deposition process, and the like. The first electrode 11 and/or the second electrode 13 may have a monolayer structure or a multilayer structure.

In cases in which the first thin-film electrode 11 is formed by a pulsed laser deposition process, for example, a surface-treated $SrTiO_3$ (STO) insulating substrate 100 may be loaded into a reaction chamber, and the insulating substrate 100 may be maintained at a temperature of about 400° C. to about 800° C., and a partial pressure of an oxidizing agent inside the chamber, for example, an oxygen partial pressure, may be maintained at about 0.01 mbar to about 1 mbar. A gaseous metal and/or gaseous metal ion to form the first thin-film electrode 11 may be supplied by vaporizing a metal and/or metal ion from a metal precursor. Subsequently, the gaseous metal and/or gaseous metal ion may be implanted onto the insulating substrate 100, and an oxidizing agent may be supplied to thereby form the first thin-film electrode 11 on the insulating substrate 100. In cases in which the first thin-film electrode 11 includes a $SrRuO_3$ layer, the metal precursor may consist of strontium or a first precursor compound containing strontium, and ruthenium or a second precursor compound containing ruthenium, wherein the oxidizing agent may include oxygen ($O_2$), ozone ($O_3$), nitrogen dioxide ($NO_2$), dinitrogen oxide ($N_2O$), or the like. The oxidizing agent may be, for example, oxygen. In the same manner, the second thin-film electrode 13 may be formed instead of the first thin-film electrode 11.

Next, a dielectric layer 13 may be disposed by epitaxy growth on one side of the first thin-film electrode layer 11 or the second thin-film electrode layer 12. The epitaxial growth may use, for example, a molecular beam epitaxy process, a pulsed laser epitaxy process, a liquid phase epitaxy process, a vapor phase epitaxy process, or the like.

The dielectric layer 13 may be selected from among, for example, doped barium-strontium-ruthenium oxide (($Ba,Sr$)$RuO_3$), doped strontium-titanium oxide ($SrTiO_3$), doped lithium-niobium oxide ($LiNbO_3$), doped potassium-niobium oxide ($KNbO_3$), doped potassium-thallium oxide ($KTaO_3$), doped barium-titanium oxide ($BaTiO_3$), doped calcium-titanium oxide ($CaTiO_3$), doped lead-titanium oxide ($PbTiO_3$), doped sodium-Niobium Oxide ($NaNbO_3$), doped sodium-thallium oxide ($NaTaO_3$), doped calcium-zirconium oxide ($CaZrO_3$), doped barium-zirconium oxide ($BaZrO_3$), doped strontium-zirconium oxide ($SrZrO_3$), wherein the dopant used for doping in the aforementioned oxides may, as a third element, include yttrium (Y), nickel (Ni), manganese (Mn), and the like.

In cases in which the dielectric layer 13 is formed by a pulsed laser deposition epitaxy process, for example, the insulating substrate 100/first thin-film electrode 11 stack prepared by the above method may be loaded into a reaction chamber, and the first thin-film electrode 11 may be maintained at a temperature of about 400° C. to about 800° C., and the partial pressure of an oxidizing agent inside the chamber, for example, an oxygen partial pressure, may be maintained at about 0.01 mbar to about 1 mbar. By vaporizing metal and/or metal ions from a metal precursor, gaseous metal and/or gaseous metal ions forming the dielectric layer 13 may be supplied. Subsequently, the gaseous metal and/or metal ions may be inserted into the first thin-film electrode 11 and then an oxidizing agent may be supplied, to thereby form the dielectric layer 13. When the dielectric layer 13 includes yttrium (Y) doped barium-strontium-ruthenium oxide (($Ba,Sr$)$RuO_3$), the metal precursor may be formed of barium or a first precursor compound containing barium, strontium or a second precursor compound containing strontium, ruthenium or a third precursor compound containing ruthenium, and yttrium or a dopant compound containing yttrium, wherein the oxidizing agent may include oxygen ($O_2$), ozone ($O_3$), nitrogen dioxide ($NO_2$) or dinitrogen oxide ($N_2O$) and the like. The oxidizing agent may be, for example, oxygen.

In cases in which the dielectric layer 12 is formed by a molecular beam epitaxy process, the insulating substrate 100/first thin-film electrode 11 stack prepared by the above method may be loaded into a reaction chamber, and the first thin-film electrode 11 may be maintained at a temperature of about 400° C. to about 800° C., and the partial pressure of an oxidizing agent inside the chamber, for example, an oxygen partial pressure, may be maintained at about $10^{-8}$ Torr to about $10^{-5}$ Torr. By vaporizing a metal from a metal precursor, a gaseous metal constituting the interlayer may be supplied. Next, after introducing the gaseous metal onto a surface-treated first thin-film electrode 11, the dielectric layer 13 may be formed on the first thin-film electrode 11 surface-treated by supplying an oxidizing agent. When the dielectric layer 13 includes yttrium (Y) doped barium-strontium-ruthenium oxide (($Ba,Sr$)$RuO_3$), the metal precursor may be formed of barium or a first precursor compound containing barium, strontium or a second precursor compound containing strontium, ruthenium or a third precursor compound containing ruthenium, and yttrium or a dopant compound containing yttrium, wherein the oxidizing agent may include oxygen ($O_2$), ozone ($O_3$), nitrogen dioxide ($NO_2$) or dinitrogen oxide ($N_2O$) and the like. The oxidizing agent may be, for example, oxygen.

In cases in which the dielectric layer 12 is formed by a chemical vapor deposition process, the insulating substrate 100/first thin-film electrode 11 stack prepared by the above method may be loaded into a reaction chamber, and the first thin-film electrode 11 may be maintained at a temperature of about 500° C. to about 600° C., and the partial pressure of an oxidizing agent inside the chamber, for example, an oxygen partial pressure, may be maintained at about 1 Torr to about 10 Torr. Next, after introducing an organic metal precursor onto a surface-treated first electrode 11, the dielectric layer 12 may be formed on the first electrode 11 surface-treated by supplying an oxidizing agent. When the dielectric layer 12 includes yttrium (Y) doped barium-strontium-ruthenium oxide (($Ba,Sr$)$RuO_3$), the organic metal precursor may be formed of barium or a first precursor compound containing barium, strontium or a second precursor compound containing strontium, ruthenium or a third precursor compound containing ruthenium, and yttrium or a dopant compound containing yttrium, wherein the oxidizing agent may include oxygen ($O_2$), ozone ($O_3$), nitrogen dioxide ($NO_2$) or dinitrogen oxide ($N_2O$) and the like. The oxidizing agent may be, for example, oxygen.

In cases in which the dielectric layer 12 is formed by an atomic layer deposition process, the insulating substrate 100/first thin-film electrode 11 stack prepared by the above method may be loaded into a reaction chamber, and the first thin-film electrode 11 may be maintained at a temperature of about 200° C. to about 400° C., and the concentration of an oxidizing agent inside the chamber, for example, an ozone concentration, may be maintained at about 100 g/m³ to about 500 g/m³. By vaporizing metal and/or metal ions from a metal precursor, gaseous metal and/or gaseous metal ions forming the dielectric layer 13 may be supplied. Subsequently, the gaseous metal and/or metal ions may be inserted into the first thin-film electrode 11 and then an oxidizing agent may be supplied, to thereby form the dielectric layer 13. When the dielectric layer 13 includes yttrium (Y) doped barium-strontium-ruthenium oxide ((Ba,Sr)RuO₃), the metal precursor may be formed of barium or a first precursor compound containing barium, strontium or a second precursor compound containing strontium, ruthenium or a third precursor compound containing ruthenium, and yttrium or a dopant compound containing yttrium, wherein the oxidizing agent may include oxygen (O₂), ozone (O₃), nitrogen dioxide (NO₂) or dinitrogen oxide (N₂O) and the like. The oxidizing agent may be, for example, ozone.

Further crystallization of materials constituting the dielectric layer 12 may be possible by performing an additional heat-treatment process on the dielectric layer 12. For example, the dielectric layer 12 may be thermally treated by rapid thermal processing (RTP) under an atmosphere of oxygen (O₂) gas, nitrogen (N₂) gas, argon (Ar) gas, ammonia (NH₄) gas, or a mixture gas thereof. The RTP may be conducted, for example, for about 30 seconds to about 3 minutes at a temperature of about 500° C. to about 650° C.

Next, another thin film electrode layer may be disposed on the dielectric layer 13 to provide a capacitor 20. The method by which the other thin film electrode layer is disposed may be the same method by which the first thin-film electrode 11 or the second thin-film electrode 12 are disposed above.

The following Examples and Comparative Examples are provided to describe the embodiments in greater detail. However, it will be understood that the Examples are provided only to illustrate the embodiments and not to be construed as limiting the scope of the embodiments.

Preparation of Capacitor

Example 1: SrRuO₃/Y-Doped BST/SrRuO₃, Thickness 100 Å, Y 1 at % Doping BST

A first thin-film electrode was formed by growing a SrRuO₃ thin film on a SrTiO₃(STO) substrate by using pulsed laser deposition. The thickness of the first thin-film electrode was 100 Å.

The pulsed laser deposition process was conducted at an oxygen partial pressure of $1 \times 10^{-2}$ Torr to $1 \times 10^{-1}$ Torr, and the substrate temperature was 700° C.

Following the same process, a dielectric layer was formed by growing a Y-doped barium strontium titanate (BST) thin film doped with 1 at % yttrium (Y) as dopant on the first thin-film electrode. The thickness of the dielectric layer was 100 Å.

The composition of the Y-doped BST was $Ba_{1-a}Sr_aTi_{0.99}Y_{0.01}O_3$ (a=0.5). Ti is a tetravalent element, and Y is a trivalent element. In other words, Ti is a tetravalent cation and Y is a trivalent cation. The ionic radius of $Ti^{4+}$ is 0.061 nm and the ionic radius of $Y^{3+}$ is 0.089 nm.

Following the same process, a second thin-film electrode layer of SrRuO₃, having a thickness of 40 Å, was disposed on the dielectric layer to thereby prepare a capacitor.

The first thin-film electrode layer, the second thin-film electrode layer, and the dielectric layer may all have a perovskite crystal structure.

FIG. 1 is a cross-section of the capacitor thus prepared. As shown in FIG. 1, it could be confirmed that Y-doped BST epitaxial layer was formed.

Example 2: SrRuO₃/Y-Doped BST/SrRuO₃, Thickness 60 Å, Y 1 at % Doping BST

A capacitor was prepared following the same process as Example 1, except that the thickness of the dielectric layer was changed to 60 Å.

Example 3: SrRuO₃/Y-Doped BST/SrRuO₃, Thickness 50 Å, Y 1 at % Doping BST

A capacitor was prepared following the same process as Example 1, except that the thickness of the dielectric layer was changed to 50 Å.

Example 4: SrRuO₃/Y-Doped BST/SrRuO₃, Thickness 100 Å, Y 2 at % Doping BST

A capacitor was prepared following the same process as Example 1, except the dopant content was changed to 2 at %.

Example 5: SrRuO₃/Y-Doped BST/SrRuO₃, Thickness 60 Å, Y 2 at % Doping BST

A capacitor was prepared following the same process as Example 1, except the dopant content was changed to 2 at % and the thickness of the dielectric layer was changed to 60 Å.

Example 6: SrRuO₃/Y-Doped BST/SrRuO₃, Thickness 50 Å, Y 2 at % Doping BST

A capacitor was prepared following the same process as Example 1, except the dopant content was changed to 2 at % and the thickness of the dielectric layer was changed to 50 Å.

Comparative Example 1: SrRuO₃/BST/SrRuO₃, Thickness 100 Å, BST (Dopant 0 at %)

A capacitor was prepared following the same process as Example 1, except doping with a dopant was not conducted (dopant 0 at %).

Comparative Example 2: SrRuO₃/BST/SrRuO₃, Thickness 60 Å, BST (Dopant 0 at %)

A capacitor was prepared following the same process as Example 1, except that doping with a dopant was not conducted and the thickness of the dielectric layer was changed to 60 Å.

Comparative Example 3: SrRuO₃/BST/SrRuO₃, Thickness 50 Å, BST (Dopant 0 at %)

A capacitor was prepared following the same process as Example 1, except that doping with a dopant was not conducted and the thickness of the dielectric layer was changed to 50 Å.

Evaluation Example 1: Permittivity Measurement

Figure 2:
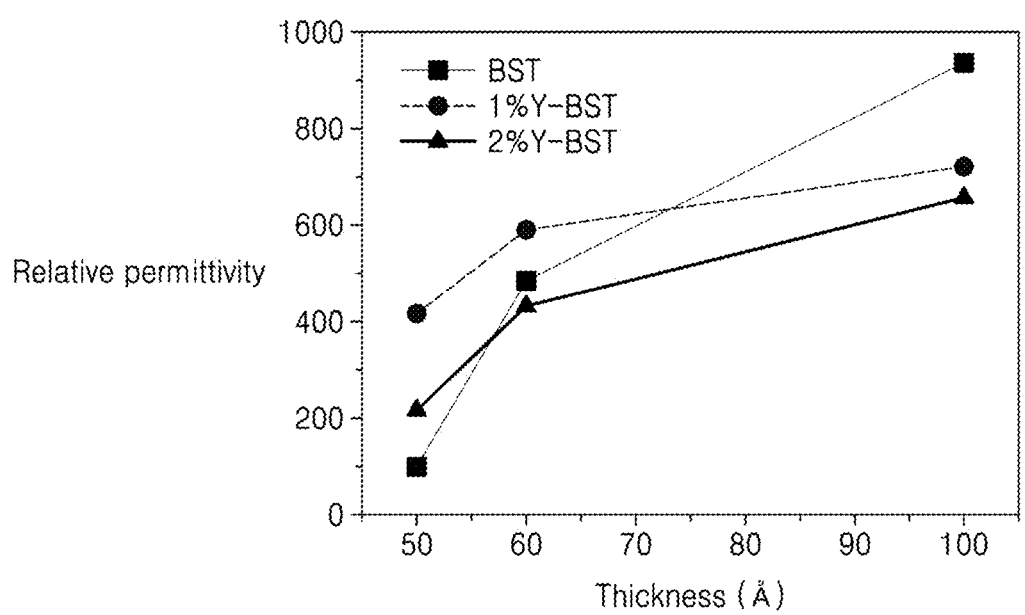
FIG. 2 is a graph showing permittivity as a function of dielectric layer thickness of capacitors prepared in Examples 1 to 6 and Comparative Examples 1 to 3.

The capacitors prepared in Examples 1 to 6 and Comparative Examples 1 to 3 were measured for relative permittivity at 1 kHz to 1 MHz at room temperature (25° C.), and the results of the measurements are shown in FIG. 2.

As shown in FIG. 2, as the thickness of the dielectric layer decreased from 100 Å to 50 Å in the capacitors of Comparative Examples 1 to 3, the permittivity of the dielectric layer drastically decreased from 900 or more to 100 or less.

Meanwhile, as the thickness of the dielectric layer decreased from 100 Å to 50 Å in the capacitors of Examples 1 to 3, the permittivity of the dielectric layer gradually decreased from 700 to 400 or more.

Compared to the capacitors of Comparative Examples 1 to 3, the capacitors of Examples 4 to 6 also showed less decrease in permittivity.

Accordingly, it was confirmed that Y doping of the dielectric layer in the capacitors of Examples 1 to 6 leads to a significant inhibition of permittivity decrease due to reduced thickness of the dielectric layer.

Evaluation Example 2: Leakage Current Measurement

The capacitors prepared in Examples 1 to 6 and Comparative Examples 1 to 3 were measured for leakage current.

Leakage current refers to a current density when a voltage of 1 V is applied to a capacitor. The results of the measurements are shown in FIG. 3 and Table 1 below.

TABLE 1

| Interlayer | Dielectric layer thickness [Å] | Leakage current [A/cm$^2$] |
|---|---|---|
| Example 4 | 100 | $3.2 \times 10^{-6}$ |
| Comparative Example 1 | 100 | $4.3 \times 10^{-2}$ |
| Example 6 | 50 | $7.0 \times 10^{-2}$ |
| Comparative Example 3 | 50 | 186 |

Figure 3:
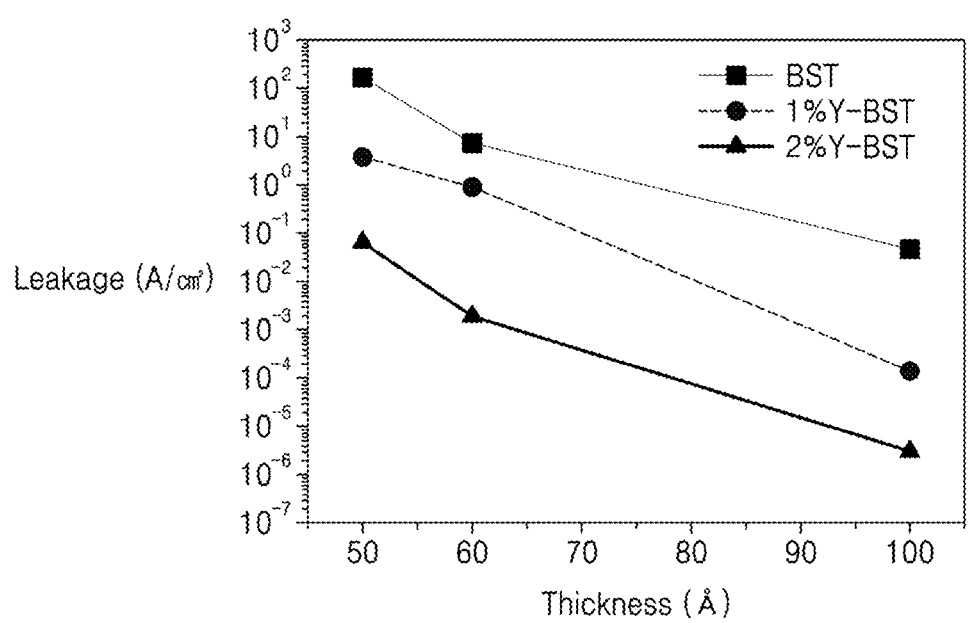
FIG. 3 is a graph showing leakage currents as a function of dielectric layer thickness of capacitors prepared in Examples 1 to 6 and Comparative Examples 1 to 3.

As shown in FIG. 3 and Table 1, the leakage current of the Y-doped capacitor of Example 4 was reduced down to $10^{-6}$ A/cm$^2$ level.

The Y-doped capacitor of Example 6 showed a leakage current reduced by four orders of magnitude.

From here, it was confirmed that the inclusion of the dopant-doped dielectric layer leads to a significant reduction in leakage current of the capacitor.

Evaluation Example 3: XRD Measurement of Dielectric Layer Prepared at 700° C.

A dielectric layer was prepared by growing an undoped BST dielectric layer having a thickness of 200 Å and a Y-doped barium strontium titanate (BST) doped with 2 at % Y (yttrium) as a dopant and having a thickness of 200 Å on a SrTiO$_3$(STO) substrate by pulsed laser deposition. The pulsed laser deposition process was conducted at an oxygen partial pressure of $1 \times 10^{-2}$ Torr to $1 \times 10^{-1}$ Torr, and the substrate temperature was 700° C. The a-axis and b-axis lattice constants of the STO substrate each were 3.905 Å.

Figure 4:
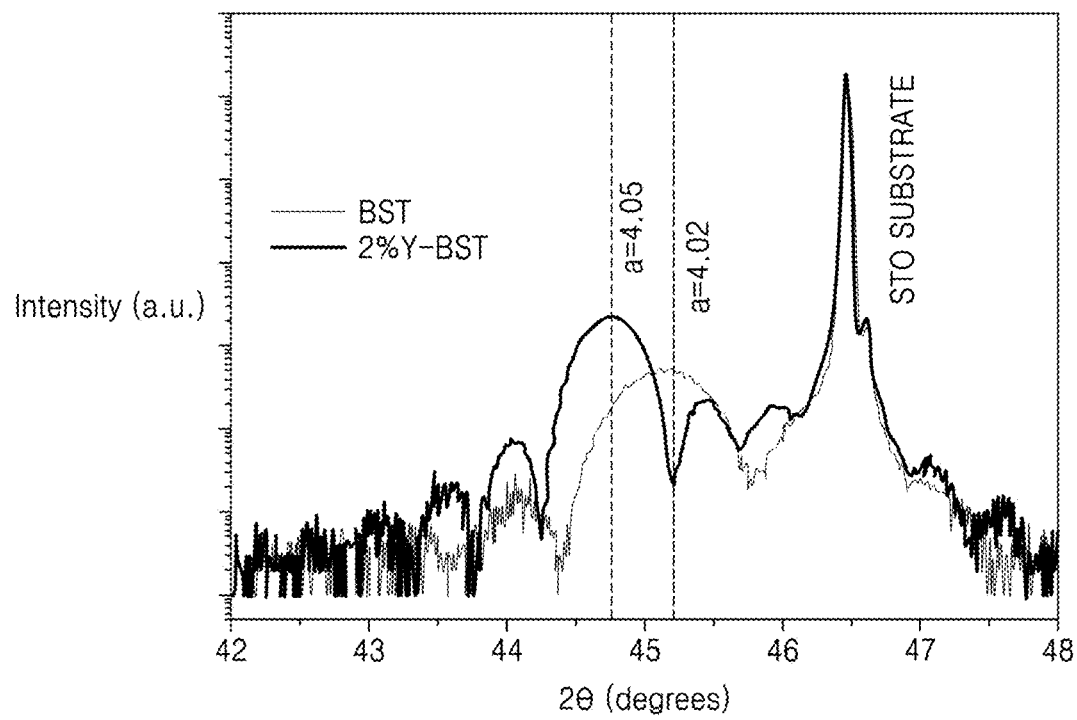
FIG. 4 is an XRD spectrum of a surface of a STO substrate/undoped BST dielectric layer stack and STO substrate/Y-doped BST dielectric layer stack prepared at 700° C.
Figure 5:
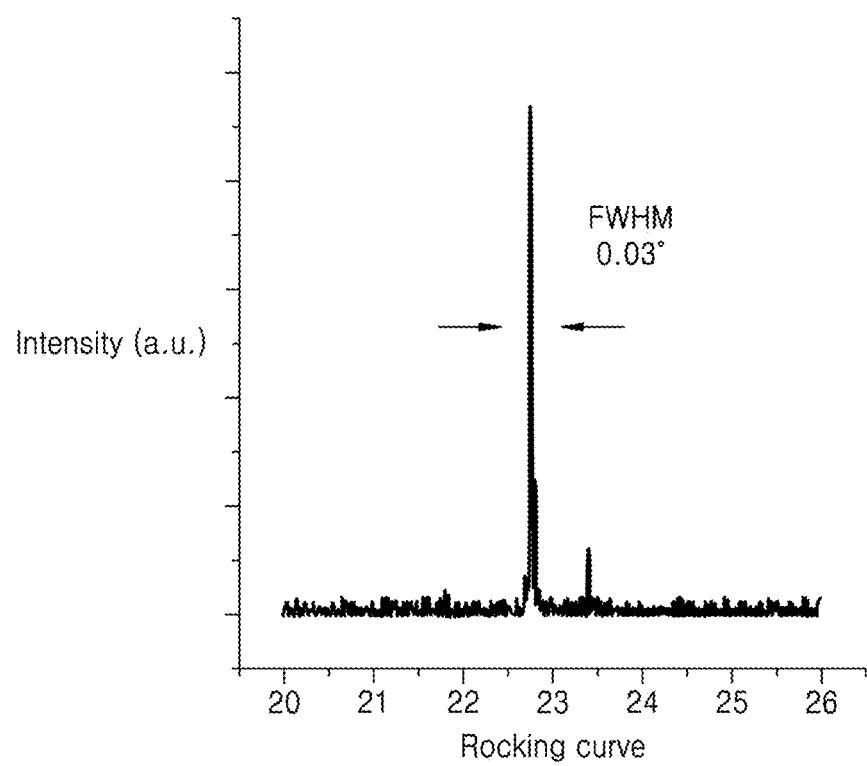
FIG. 5 is a rocking curve for a surface of a STO substrate/Y-doped BST dielectric layer stack prepared at 700° C.

XRD spectra were obtained with regard to the surfaces of the stack of STO substrate/undoped BST dielectric layer and the stack of STO substrate/Y-doped BST dielectric layer, and the results thereof are shown in FIG. 4 and FIG. 5.

FIG. 4 shows an XRD spectrum obtained from θ axis and 2θ axis scans (sample and detector scan).

FIG. 5 shows a rocking curve, which is an XRD spectrum obtained from θ axis scan (sample scan or sample rocking).

As shown in FIG. 4, the peak positions have shifted to lower angles in the Y-doped BST dielectric layer, compared to the undoped BST dielectric layer. The c-axis (e.g., [001] direction) lattice constant of the undoped BST was 4.02 Å. The c-axis (e.g., [001] direction) lattice constant of the Y-doped BST was 4.05 Å. Accordingly, it was confirmed that the lattice constant of the Y-doped BST increases compared to the c-axis lattice constant of the undoped BST.

It was considered that such increase in c-axis lattice constant was due to the doping with Y, which has greater ionic radii than the ionic radii of Ti, a compressive strain is applied to the octahedral site, thus causing the lattice distance to increase along c-axis. The c-axis lattice constant in the Y-doped BST was higher than the c-axis lattice constant in the BST, thus indicating that polarization is more easily inducible in the Y-doped BST.

As shown in FIG. 5, in the Y-doped BST, the full width at half maximum (FWHM) of the peak on (200) plane at a diffraction angle of $\theta=22.5°\pm0.5°$ was 0.03°, indicating a very high crystallinity. From here, it was confirmed that the Y-doped BST dielectric layer was an epitaxial layer obtained by epitaxy growth and had a single crystal or a high crystallinity comparable thereto.

Evaluation Example 4: XRD Measurement of Dielectric Layer Prepared at 500° C.

A stack of STO substrate/undoped BST dielectric layer and a stack of STO substrate/Y-doped BST dielectric layer were prepared following the same process as in Evaluation Example 3, except that the substrate temperature was changed to 500° C.

Figure 6:
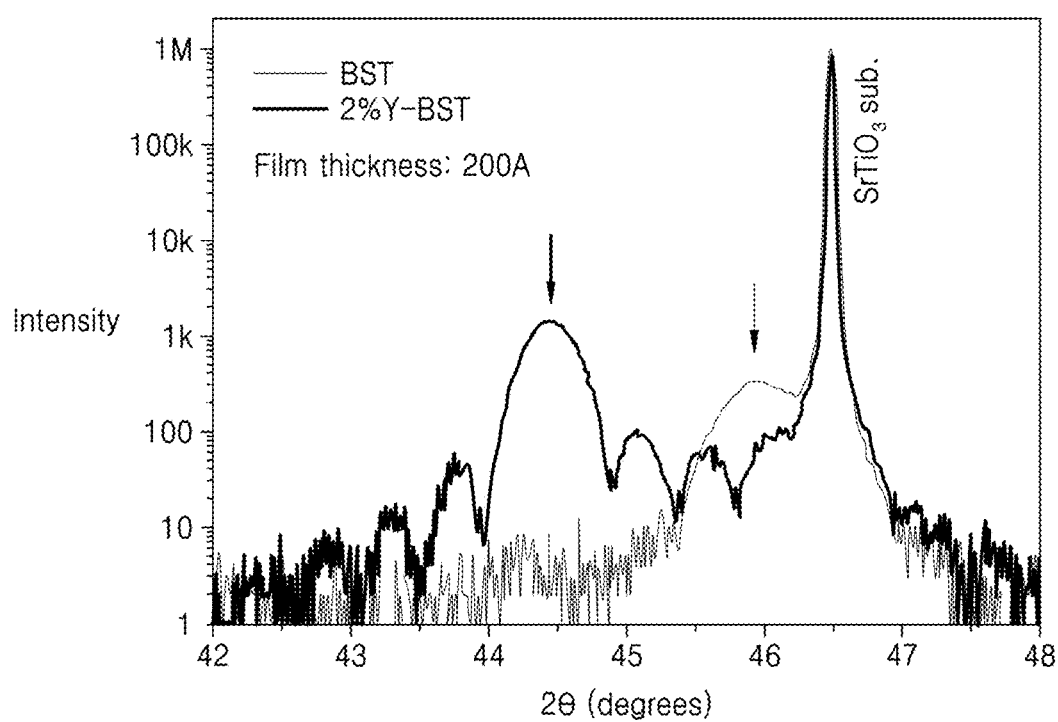
FIG. 6 is a rocking curve for a surface of a STO substrate/undoped BST dielectric layer stack and STO substrate/Y-doped BST dielectric layer stack prepared at 500° C.

XRD spectra were obtained with regard to the surfaces of the stack of STO substrate/undoped BST dielectric layer and the stack of STO substrate/Y-doped BST dielectric layer, and the results thereof are shown in FIG. 6.

FIG. 6 shows an XRD spectrum obtained from θ axis and 2θ axis scans (sample and detector scan).

As shown in FIG. 6, compared to the result of Evaluation Example 3, the peak positions in the undoped BST dielectric layer shifted to a higher angle and the peak intensities also diminished.

The c-axis (e.g., [001] direction) lattice constant of the undoped BST was 3.95 Å. The c-axis lattice constant of the Y-doped BST was 4.07 Å.

In the undoped BST, it was considered that during the strain release process at 500° C., epitaxial structures were not maintained and crystallinity deteriorated, and due to this deterioration in crystallinity the c-axis lattice constant was decreased. Meanwhile, in the Y-doped BST, it was considered that high epitaxial structures and crystallinity were maintained even at 500° C., thus leading to an increase in the c-axis lattice constant. That is, it was confirmed that the Y-doped BST dielectric layer prepared at 500° C. was an epitaxial layer obtained by epitaxy growth, and had a single crystal or a high crystallinity comparable thereto.

Although not illustrated in the drawings, on the rocking curve of the Y-doped BST, the FWHM of peak with respect to (200) plane was 0.05°, indicating that crystallinity is still high.

Evaluation Example 5: XRD Measurement of Dielectric Layer Prepared at 300° C.

A stack of STO substrate/undoped BST dielectric layer and a stack of STO substrate/Y-doped BST dielectric layer were prepared following the same process as in Evaluation Example 3, except that the substrate temperature was changed to 300° C.

Figure 7:
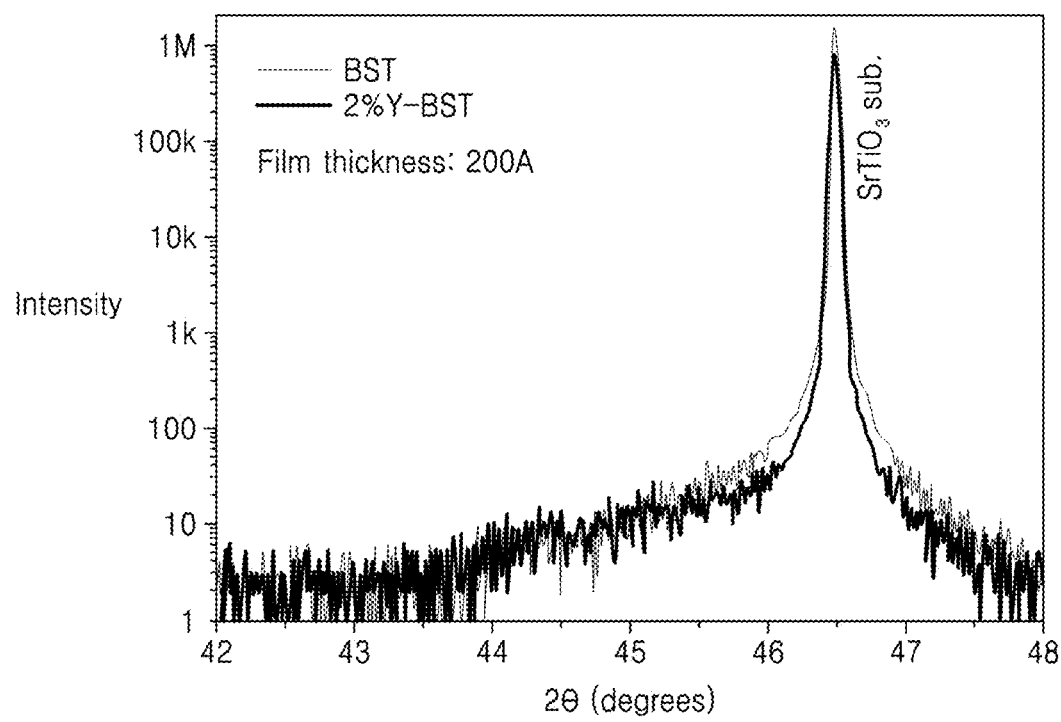
FIG. 7 is a rocking curve for a surface of a STO substrate/undoped BST dielectric layer stack and STO substrate/Y-doped BST dielectric layer stack prepared at 300° C.

XRD spectra were obtained with regard to the surfaces of the stack of STO substrate/undoped BST dielectric layer and the stack of STO substrate/Y-doped BST dielectric layer, and the results thereof are shown in FIG. 7.

FIG. 7 shows an XRD spectrum obtained from θ axis and 2θ axis scans (sample and detector scan).

As shown in FIG. 7, only the peak of STO substrate appeared, while there were no peaks of undoped BST dielectric layer or Y-doped BST dielectric layer.

From this, it was confirmed that at 300° C., an amorphous or partially crystallized undoped BST dielectric layer, and an amorphous or partially crystallized Y-doped BST dielectric layer were formed.

Evaluation Example 6: Calculation of Schottky Barrier Height (SBH) and Interlayer Compared to the stack of SrRuO$_3$(electrode)/SrTiO$_3$(dielectric material), variation ($\Delta V$) in Schottky barrier height (SBH) of the stack with an interlayer disposed between SrRuO$_3$/SrTiO$_3$ was calculated, and part of the results thereof is shown in Table 2.

The interlayer was disposed between SrRuO$_3$/SrTiO$_3$. The interlayer was a perovskite compound of ABO$_3$ composition.

Permittivity and band gaps were calculated within the framework of density functional theory (DFT) using Vienna ab initio simulation package (VASP).

SBH of the stack with interlayer disposed therein may be represented by Equation 1.

$$SBH = \phi - \chi + \Delta V \qquad \text{Equation 1}$$

In Equation 1, φ represents work function of an electrode, X represents electron affinity of dielectric material, and ΔV represents SBH change.

TABLE 2

| Interlayer | SBH change [eV] |
| --- | --- |
| — | — |
| ScGaO$_3$ | 0.60 |
| LaAlO$_3$ | 0.50 |

As shown in Table 2, placement of the interlayer between the electrode and the dielectric layer results in an increase in SBH of the stack.

This result confirms that the interlayer disposed between the electrode and the dielectric layer is suitable as a leakage current blocking layer of a capacitor.

According to one aspect, by including an electrode with a novel structure and a dielectric layer, permittivity decrease of the capacitor due to decrease in thickness of the dielectric material may be suppressed, and leakage currents of the capacitor may be controlled.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
a first thin-film electrode layer;
a second thin-film electrode layer; and
a dielectric layer between the first thin-film electrode layer and the second thin-film electrode layer,
wherein the first thin-film electrode layer and the second thin-film electrode layer each have a conductive perovskite-type crystal structure,
the dielectric layer includes a metal oxide having a dielectric perovskite-type crystal structure, and the dielectric layer is an epitaxial layer,
wherein the metal oxide includes a first element in a cubooctahedral site, a second element in an octahedral site, and a third element in an octahedral site,
wherein a valency of the third element is lower than a valency of the second element, and
the third element is a dopant.

2. The capacitor of claim 1, wherein the valency of the second element is 4 or more, and the third element has a valency of 3 or less.

3. The capacitor of claim 1, wherein the third element is at least one of Y, Mg, Ni, Fe, Mn, Co, Al, Cr, Bi, Cr, and Ga.

4. The capacitor of claim 1, wherein ionic radii of the third element are greater than ionic radii of the second element.

5. The capacitor of claim 1, wherein
the metal oxide is a ternary metal oxide, and
a crystal lattice of the metal oxide has a compressive strain along c-axis.

6. The capacitor of claim 5, wherein
in the crystal lattice of the metal oxide, a c-axis lattice constant is larger than at least one of an a-axis lattice constant and a b-axis lattice constant, and
the c-axis lattice constant is about 3.96 Å to about 4.20 Å.

7. The capacitor of claim 1, wherein
a content of the third element is about 0.1 at % to about 9 at % with respect to a total sum of the second element and the third element.

8. The capacitor of claim 1, wherein the dielectric layer comprises a metal oxide represented by Formula 1 below:

$$A1_{1-a}D1_aB1_{1-b}C1_bO_{3-\delta} \qquad \text{Formula 1}$$

wherein in Formula 1,
0≤a<1, 0.001<b<0.09, and 0≤δ≤0.5,
A1 and D1 each are an element with a valency of 2,
B1 is an element with a valency of 4, and
C1 is an element with a valency of 1, an element with a valency of 2, or an element with a valency of 3.

9. The capacitor of claim 5, wherein C1 is at least one of Y, Mg, Ni, Fe, Mn, Co, Al, Cr, Bi, Cr, and Ga.

10. The capacitor of claim 1, wherein the dielectric layer comprises a metal oxide represented by Formula 2 below:

$$Ba_{1-a}Sr_aTi_{1-b}C2_bO_{3-\delta} \quad \text{Formula 2}$$

wherein, in Formula 2,
0<a<1, 0.001<b<0.08, and 0≤δ≤0.5,
wherein C2 is at least one of Y, Mg, Ni, Fe, Mn, Co, Al, Cr, Bi, Cr, and Ga.

11. The capacitor of claim 1, wherein
on an XRD spectrum of the dielectric layer, a rocking curve is observed by θ scan between an X-ray source and a sample surface,
the rocking curve has a first peak on (200) plane at a diffraction angle of θ=22.5°±0.5°, and
a full width at half maximum (FWHM) of the first peak is 0.1° or less.

12. The capacitor of claim 1, wherein
a ratio (εr2/εr1) of a first relative permittivity (εr1) at a thickness of 100 Å of the dielectric layer to a second relative permittivity (εr2) at a thickness of 50 Å of the dielectric layer is 0.2 or more.

13. The capacitor of claim 1, wherein
the dielectric layer has a thickness of about 10 Å to about 500 Å,
the dielectric layer has at least one of a flat-plate structure, a trench structure, and a pillar structure, and
the dielectric layer has a monolayer membrane structure or a multilayer membrane structure.

14. The capacitor of claim 1, wherein
the first thin-film electrode layer, the second thin-film electrode layer, or both the first thin-film electrode layer and the second thin-film electrode layer comprise a ternary metal oxide,
the ternary metal oxide comprises the first element,
the first thin-film electrode layer, the second thin-film electrode layer, or both the first thin-film electrode layer and the second thin-film electrode layer independently comprise at least one of $SrRuO_3$, $SrVO_3$, $SrNbO_3$, $SrMnO_3$, $SrCrO_3$, $SrFeO_3$, $SrCoO_3$, $SrMoO_3$, $SrIrO_3$, $SrCoO_3$, $CaRuO_3$, $CaNiO_3$, $BaRuO_3$, and $(Ba, Sr)RuO_3$.

15. The capacitor of claim 1, further comprising:
an interlayer, wherein
the interlayer is between the first thin-film electrode layer and the dielectric layer, between the second thin-film electrode layer and the dielectric layer, or the interlayer is between the first thin-film electrode layer and the dielectric layer and the interlayer is between the second thin-film electrode layer and the dielectric layer,
wherein the interlayer has a same type of crystal structure as at least one of the first thin-film electrode layer, the second thin-film electrode layer, and the dielectric layer,
wherein the first thin-film electrode layer, the second thin-film electrode layer, and the dielectric layer are in contact with the interlayer,
wherein a composition of the interlayer is different from a composition of the first thin-film electrode layer, a composition of the second thin-film electrode layer, and a composition the dielectric layer.

16. The capacitor of claim 15, wherein the interlayer has a perovskite-type crystal structure, and
the interlayer comprises a metal oxide represented by Formula 3, a metal oxide represented by Formula 4, or a metal oxide represented by Formula 5:

$$A2B2O_{3-\delta 1} \quad \text{Formula 3}$$

wherein in Formula 3,
A2 is an element with a valency of 2,
B2 is an element with a valency of 1, an element with a valency of 2, or an element with a valency of 3,
1.5≤δ1≤3.0

$$A3B3O_{3-\delta 2} \quad \text{Formula 4}$$

wherein in Formula 4,
A3 is an element with a valency of 1,
B3 is an element with a valency of 4, and
1.5≤δ2≤3.0

$$A4B4O_{3-\delta 3} \quad \text{Formula 5}$$

wherein in Formula 5,
A4 is an element with a valency of 3,
B4 is an element with a valency of 3, and
2.5≤δ3≤3.0.

17. The capacitor of claim 15, wherein
the interlayer comprises a metal oxide selected from among
$SrGaO_{3-\delta 1}$, $CaGaO_{3-\delta 1}$, $BaGaO_{3-\delta 1}$, $MgGaO_{3-\delta 1}$, $BeGaO_{3-\delta 1}$,
$SrInO_{3-\delta 1}$, $CaInO_{3-\delta 1}$, $BaInO_{3-\delta 1}$, $MgInO_{3-\delta 1}$, $BeInO_{3-\delta 1}$,
$SrBeO_{3-\delta 1}$, $CaBeO_{3-\delta 1}$, $BaBeO_{3-\delta 1}$, $MgBeO_{3-\delta 1}$,
$SrMgO_{3-\delta 1}$, $CaMgO_{3-\delta 1}$, $BaMgO_{3-\delta 1}$, $BeMgO_{3-\delta 1}$,
$SrBaO_{3-\delta 1}$, $CaBaO_{3-\delta 1}$, $MgBaO_{3-\delta 1}$, $BeBaO_{3-\delta 1}$,
$SrCaO_{3-\delta 1}$, $BaCaO_{3-\delta 1}$, $MgCaO_{3-\delta 1}$, $BeCaO_{3-\delta 1}$,
$SrLiO_{3-\delta 1}$, $CaLiO_{3-\delta 1}$, $BaLiO_{3-\delta 1}$, $MgLiO_{3-\delta 1}$, $BeLiO_{3-\delta 1}$,
$SrNaO_{3-\delta 1}$, $CaNaO_{3-\delta 1}$, $BaNaO_{3-\delta 1}$, $MgNaO_{3-\delta 1}$, $BeNaO_{3-\delta 1}$,
$SrKO_{3-\delta 1}$, $CaKO_{3-\delta 1}$, $BaKO_{3-\delta 1}$, $MgKO_{3-\delta 1}$, $BeKO_{3-\delta 1}$,
$SrRbO_{3-\delta 1}$, $CaRbO_{3-\delta 1}$, $BaRbO_{3-\delta 1}$, $MgRbO_{3-\delta 1}$, $BeRbO_{3-\delta 1}$,
$LiTiO_{3-\delta 2}$, $NaTiO_{3-\delta 2}$, $KTiO_{3-\delta 2}$, $RbTiO_{3-\delta 2}$,
$LiZrO_{3-\delta 2}$, $NaZrO_{3-\delta 2}$, $KZrO_{3-\delta 2}$, $RbZrO_{3-\delta 2}$,
$LiHfO_{3-\delta 2}$, $NaHfO_{3-\delta 2}$, $KHfO_{3-\delta 2}$, and $RbHfO_{3-\delta 2}$,
$ScAlO_{3-\delta 3}$, $YAlO_{3-\delta 3}$, $LaAlO_{3-\delta 3}$, $CeAlO_{3-\delta 3}$, $PrAlO_{3-\delta 3}$, $NdAlO_{3-\delta 3}$, $SmAlO_{3-\delta 3}$, $DyAlO_{3-\delta 3}$,
$ScGaO_{3-\delta 3}$, $YGaO_{3-\delta 3}$, $LaGaO_{3-\delta 3}$, $CeGaO_{3-\delta 3}$, $PrGaO_{3-\delta 3}$, $NdGaO_{3-\delta 3}$, $SmGaO_{3-\delta 3}$, $DyGaO_{3-\delta 3}$,
$ScInO_{3-\delta 3}$, $YInO_{3-\delta 3}$, $LaInO_{3-\delta 3}$, $CeInO_{3-\delta 3}$, $PrInO_{3-\delta 3}$, $NdInO_{3-\delta 3}$, $SmInO_{3-\delta 3}$, and $DyInO_{3-\delta 3}$,
wherein 1.5≤δ1≤3.0, 1.5≤δ2≤3.0, and 2.5≤δ3≤3.0.

18. The capacitor of claim 15, wherein
the interlayer has a thickness of about 1 Å to about 20 Å,
a Schottky Barrier Height (SBH) between the dielectric layer and the first thin-film electrode layer or second thin-film electrode layer is 1.5 eV or more, and
the interlayer is an epitaxial layer.

19. A device comprising
the capacitor according to claim 1.

20. The device of claim 19, wherein the device comprises a memory device, a logic device, or an energy storage device.

21. A method of preparing a capacitor, the method comprising:
forming a dielectric layer on one side of a first thin-film electrode layer by epitaxy growth; and
forming a second thin-film electrode layer on the dielectric layer to thereby provide the capacitor,
wherein the capacitor includes the dielectric layer between the first thin-film electrode layer and the second thin-film electrode layer,
wherein the first thin-film electrode layer and the second thin-film electrode layer have a conductive perovskite-type crystal structure, the dielectric layer includes a metal oxide having a dielectric perovskite-type crystal structure,
the metal oxide includes a first element in a cubooctahedral site, a second element in an octahedral site, and a third element in an octahedral site,
a valency of the third element is lower than a valency of the second element, and
the third element is a dopant.

22. The method of claim 21, wherein the epitaxy growth is conducted at a temperature of 600° C. or less.

23. The method of claim 21, further comprising:
before the forming the dielectric layer,
forming an interlayer on the one side of the first thin-film electrode layer by epitaxy growth.

* * * * *